United States Patent
Inoue et al.

(10) Patent No.: US 11,398,518 B2
(45) Date of Patent: Jul. 26, 2022

(54) SOLID-STATE IMAGE PICKUP ELEMENT AND ELECTRONIC APPARATUS

(71) Applicant: SONY CORPORATION, Tokyo (JP)

(72) Inventors: Keishi Inoue, Kumamoto (JP); Kenju Nishikido, Kumamoto (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 17/076,498

(22) Filed: Oct. 21, 2020

(65) Prior Publication Data
US 2021/0043674 A1 Feb. 11, 2021

Related U.S. Application Data

(63) Continuation of application No. 16/069,134, filed as application No. PCT/JP2017/000072 on Jan. 5, 2017, now Pat. No. 10,854,657.

(30) Foreign Application Priority Data

Jan. 18, 2016 (JP) .................. 2016-007023

(51) Int. Cl.
| | |
|---|---|
| *H01L 27/146* | (2006.01) |
| *H04N 5/369* | (2011.01) |
| *H01L 23/00* | (2006.01) |

(52) U.S. Cl.
CPC ........ *H01L 27/14636* (2013.01); *H01L 24/03* (2013.01); *H01L 24/05* (2013.01);
(Continued)

(58) Field of Classification Search
None
See application file for complete search history.

(56) References Cited

U.S. PATENT DOCUMENTS

| | | | |
|---|---|---|---|
| 2010/0238331 A1* | 9/2010 | Umebayashi | ....... H01L 27/1469 348/294 |
| 2013/0099098 A1 | 4/2013 | Kobayashi | |
| 2016/0233264 A1* | 8/2016 | Kagawa | ............ H01L 27/14687 |

FOREIGN PATENT DOCUMENTS

| | | |
|---|---|---|
| JP | 2005-191492 | 7/2005 |
| JP | 2010-245506 | 10/2010 |

(Continued)

OTHER PUBLICATIONS

Official Action (no English translation available) for Japanese Patent Application No. 2017562495, dated Nov. 10, 2020, 3 pages.
(Continued)

*Primary Examiner* — Hsien Ming Lee
(74) *Attorney, Agent, or Firm* — Sheridan Ross P.C.

(57) ABSTRACT

The present technique relates to a solid-state image pickup element and an electronic apparatus each of which enables a pad to be formed in a shallow position while reduction of a quality of a back side illumination type solid-state image pickup element is suppressed. The solid-state image pickup element includes a pixel substrate in which a light condensing layer for condensing incident light on a photoelectric conversion element, a semiconductor layer in which the photoelectric conversion element is formed, and a wiring layer in which a wiring and a pad for outside connection are formed are laminated on one another, and at least a part of a first surface of the pad is exposed through a through hole completely extending through the light condensing layer and the semiconductor layer. The present technique, for example, can be applied to a back side illumination type CMOS image sensor.

19 Claims, 20 Drawing Sheets

(52) U.S. Cl.
CPC .......... *H01L 24/08* (2013.01); *H01L 27/1464* (2013.01); *H01L 27/14625* (2013.01); *H01L 27/14634* (2013.01); *H01L 27/14643* (2013.01); *H01L 27/14683* (2013.01); *H04N 5/369* (2013.01); *H04N 5/379* (2018.08); *H01L 27/14621* (2013.01); *H01L 27/14627* (2013.01); *H01L 2224/03616* (2013.01); *H01L 2224/03622* (2013.01); *H01L 2224/0557* (2013.01); *H01L 2224/05624* (2013.01); *H01L 2224/05647* (2013.01); *H01L 2224/08147* (2013.01)

(56) References Cited

FOREIGN PATENT DOCUMENTS

| | | | | |
|---|---|---|---|---|
| JP | 2012-235126 | 11/2012 | | |
| JP | 2014-072297 | 4/2014 | | |
| WO | WO-2015050000 A1 * | 4/2015 | ....... | H01L 21/76898 |
| WO | WO 2015-159766 | 10/2015 | | |

OTHER PUBLICATIONS

Official Action (with English translation) for Japan Patent Application No. 2021-101695, dated May 31, 2022, 7 pages.

* cited by examiner

PROCESS 1

PROCESS 2

PROCESS 3

PROCESS 4

SOLID-STATE IMAGE PICKUP ELEMENT AND ELECTRONIC APPARATUS

CROSS REFERENCE TO RELATED APPLICATIONS

This application is a continuation of U.S. patent application Ser. No. 16/069,134 filed Jul. 10, 2018, which is a national stage application under 35 U.S.C. 371 and claims the benefit of PCT Application No. PCT/JP2017/000072 having an international filing date of Jan. 5, 2017, which designated the United States, which PCT application claimed the benefit of Japanese Patent Application No. 2016-007023 filed Jan. 18, 2016, the entire disclosures of each of which are incorporated herein by reference.

TECHNICAL FIELD

The present technique relates to a solid-state image pickup element and an electronic apparatus, and more particularly to a back side illumination type solid-state image pickup element and an electronic apparatus using the back side illumination type solid-state image pickup element.

BACKGROUND ART

In recent years, a laminated back side illumination type solid-state image pickup element has become popular in which a pixel substrate and a control substrate are laminated on each other. In this case, pixels are formed on the pixel substrate. A control circuit for carrying out control for the pixels, processing for a pixel signal, and the like is formed on the control substrate.

For example, in the case where in the laminated back side illumination type solid-state image pickup element, a pad is formed in a wiring layer of the control substrate, a position of the pad becomes deep when viewed from the pixel substrate side (light receiving surface side). As a result, in a wire bonding process, a process margin becomes narrow. In addition, it is feared that a tip of a ball for wire connection (hereinafter, referred to as a wire bond ball) which is formed on the pad is not sufficiently exposed from the surface of the pixel substrate, and thus tests for various kinds of assembly processes become difficult to carry out. For example, it is feared that a test for strength of bonding between the wire bonding ball and the pad becomes difficult to carry out.

On the other hand, heretofore, it has been proposed that in the back side illumination type solid-state image pickup element, a pad is formed on an upper surface of a wiring on an uppermost layer of a wiring layer of the pixel substrate (for example, refer to PTL 1). In addition, heretofore, it has also been proposed that in the back side illumination type solid-state image pickup element, a pad is formed within a semiconductor layer, in which a photoelectric conversion element and the like are formed, of the pixel substrate (for example, refer to PTL 2). In any case, as compared with the case where the pad is formed in the wiring layer of the control substrate, the position of the pad can be made shallow.

CITATION LIST

Patent Literature

[PTL 1]
 Japanese Patent Laid-Open No. 2012-235126
[PTL 2]
 Japanese Patent Laid-Open No. 2005-191492

SUMMARY

Technical Problems

However, in the case where the pad is formed on the upper surface of the wiring in the uppermost layer of the wiring layer of the pixel substrate, since a through hole for formation of the pad is formed in the semiconductor layer, the undulation is generated on the semiconductor layer. Owing to the undulation generated on the semiconductor layer, a coating film becomes difficult to uniformly form in a light condensing process for forming a color filter, a microlens, and the like on the semiconductor layer. As a result, the surface irregularity is generated in a thickness of the coating film, and thus it is feared that the light condensing characteristics become worse.

In addition, in the case where the pad is generated in the semiconductor layer of the pixel substrate, for example, a limitation of the temperatures is caused in a high-temperature process for forming a semiconductor element in the semiconductor layer. For example, in the case where the pad is made of Al (aluminum), the temperature of the high-temperature process needs to be suppressed to approximately 400° C. or less. As a result, it is feared that the characteristics of the semiconductor element become worse.

On the other hand, for the purpose of avoiding a limitation of the temperature in the high-temperature process, in the case where the pad is formed after the semiconductor element is formed on the semiconductor layer, for planarizing a trench in which the pad is filled, and a gate of the semiconductor element, an interlayer film of the wiring layer needs to be thickened. As a result, it is feared that the circuit characteristics become worse due to an increase in a contact resistance of the wiring layer, and the like.

In the light of the foregoing, the present technique enables a pad to be formed in a suitable position while reduction of a quality of a back side illumination type solid-state image pickup element is suppressed.

Solution to Problems

A solid-state image pickup element of a first aspect of the present technique is provided with a pixel substrate in which a light condensing layer, a semiconductor layer, and a wiring layer are laminated, and at least a part of a first surface of a pad is exposed through a through hole completely extending through the light condensing layer and the semiconductor layer. In this case, the light condensing layer serves to condense incident light on a photoelectric conversion element. The photoelectric conversion element is formed in the semiconductor layer. A wiring and the pad for outside connection are formed in the wiring layer.

The wiring of the wiring layer can be connected to a second surface on a side opposite to the first surface of the pad through a via.

The wiring of the wiring layer can be connected to a side surface of the pad.

A control substrate provided with a control circuit and laminated on the wiring layer side of the pixel substrate can be further provided.

A support substrate laminated on the wiring layer side of the pixel substrate can be further provided.

A control substrate, a first via, and a second via can be further provided. In this case, a control circuit is arranged on the control substrate, and the control substrate is laminated on the wiring layer side of the pixel substrate. The first via completely extends through the semiconductor layer, and is connected to the first surface of the pad. The second via is connected to the first via in the light condensing layer, completely extends through the semiconductor layer and the wiring layer, and is connected to a wiring of the control substrate.

A control substrate and a via can be further provided. In this case, a control circuit is arranged in the control substrate, and the control substrate is laminated on the wiring layer side of the pixel substrate. The via completely extends through the semiconductor layer and the wiring layer, and a side surface of the pad and a wiring of the control substrate are connected to each other through the via.

An electronic apparatus of a second aspect of the present technique is provided with a solid-state image pickup element and a signal processing portion for processing a signal output from the solid-state image pickup element. The solid-state image pickup element is provided with a pixel substrate in which a light condensing layer, a semiconductor layer, and a wiring layer are laminated. In this case, the light condensing layer serves to condense incident light on a photoelectric conversion element. The photoelectric conversion element is formed in the semiconductor layer. A wiring and a pad for outside connection are formed in the wiring layer, and at least a part of the first surface of the pad is exposed through a through hole completely extending through the light condensing layer and the semiconductor layer.

In the first aspect or the second aspect of the present technique, the solid-state image pickup element is connected to the outside through the pad.

Advantageous Effect of Invention

According to the first aspect or the second aspect of the present technique, the pad can be formed in the suitable position while the reduction of the quality of the back side illumination type solid-state image pickup element is suppressed.

It should be noted that the effect described here is not necessarily limited, and any of the effects described in the present disclosure may be offered.

DESCRIPTION OF EMBODIMENTS

Hereinafter, modes for carrying out the invention (hereinafter, described as "embodiments") will be described in detail with reference to the drawings. It should be noted that the description will be given in accordance with the following order.

Figure 1:
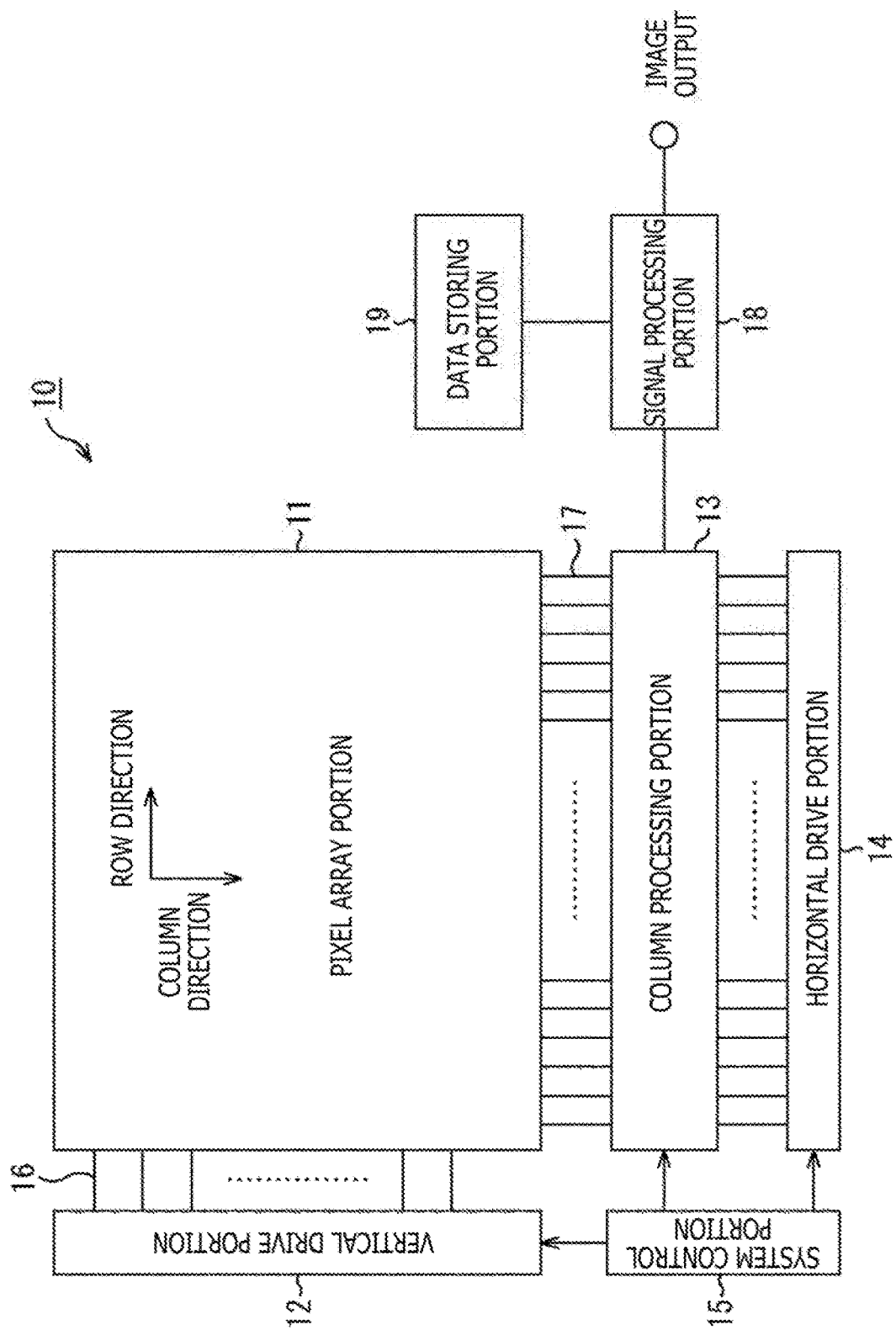
FIG. 1 is a system configuration diagram depicting an outline of a configuration of a CMOS image sensor to which the present technique is applied.

1. Solid-State Image Pickup Element to Which the Present Technique is Applied
2. First Embodiment (an example in which a wiring is directly connected to a pad)
3. Second Embodiment (an example in which a pad is connected to a wiring through a via)
4. Third Embodiment (a first example in which a pad and a control substrate are connected to each other through a via)
5. Fourth Embodiment (a second example in which the pad and the control substrate are connected to each other through a via)
6. Modified Changes
7. Examples of Use of Solid-State Image Pickup Element 1. Solid-State Image Pickup Element to Which the Present Technique is Applied Basic System Configuration FIG. 1 is a system configuration diagram depicting an outline of a configuration of a solid-state image pickup element to which the present technique is applied, for example, a CMOS image sensor as a sort of X-Y address system solid-state image pickup element. Here, the CMOS image sensor means an image sensor which is manufactured by applying a CMOS process, or by partially using the CMOS process.

A CMOS image sensor 10 according to the present application example is provided with a pixel array portion 11 and a peripheral circuit portion. The peripheral circuit portion, for example, is provided with a vertical drive portion 12, a column processing portion 13, a horizontal drive portion 14, and a system control portion 15.

The CMOS image sensor 10 is further provided with a signal processing portion 18 and a data storing portion 19. The signal processing portion 18 and the data storing portion 19 may be both mounted on the same substrate as that of the CMOS image sensor 10, or may be both arranged on a substrate different from that of the CMOS image sensor 10.

In addition, pieces of processing executed by the signal processing portion 18 and the data storing portion 19 may be pieces of processing executed by an external signal processing portion provided on a substrate different from that of the CMOS image sensor 10, for example, a DSP (Digital Signal Processor) circuit, or software.

The pixel array portion 11 is configured in such a way that a plurality of unit pixels (hereinafter, simply referred to as "pixels" in some cases) is arranged in a row direction and in a column direction. Here, the row direction means an array direction (that is, a horizontal direction) of the pixels in the pixel rows, and the column direction means an array direction (that is, the vertical direction) of the pixels in the pixel columns.

The unit pixel has a photoelectric conversion portion (for example, a photodiode) for producing and accumulating electric charges responding to a light quantity of received light, and a plurality of pixel transistors (so-called MOS transistors). It should be noted that an example of a configuration of the unit pixel will be described later with reference to FIG. 2.

In addition, in the pixel array portion 11, a pixel drive line 16 as a row signal line is wired along the row direction every pixel row, and a vertical signal line 17 as a column signal line is wired along the column direction every pixel column. The pixel drive line 16 transmits a drive signal in accordance with which the drive is carried out when a signal is read out from the pixel. Although in FIG. 1, one wiring is illustrated as the pixel drive line 16, the number of pixel drive lines 16 is by no means limited to one. One ends of the pixel drive lines 16 are connected to output ends corresponding to the respective rows of the vertical drive portion 12.

The vertical drive portion 12 includes a shift register, an address decoder, and the like, and drives the pixels of the pixel array portion 11 simultaneously in all the pixels, in units of rows, or the like. That is, the vertical drive portion 12 configures, together with the system control portion 15 for controlling the vertical drive portion 12 concerned, a drive portion for controlling the operations of the respective pixels of the pixel array portion 11. Although a concrete configuration of the vertical drive portion 12 is omitted in illustration thereof, in general, the vertical drive portion 12 is configured to have two scanning systems: a read scanning system; and a sweep scanning system.

The read scanning system, for reading out the signal from the unit pixel, selectively scans in order the unit pixels of the pixel array portions 11 in units of rows. The signal read out from the unit pixel is an analog signal. The sweep scanning system carries out the sweep scanning for the read row for which the read scanning is carried out by the read scanning system prior to the read scanning by an exposure time.

The sweep scanning by the sweep scanning system results in that the unnecessary electric charges are swept out from the photoelectric conversion portion of the unit pixel of the read row, thereby resetting the photoelectric conversion portion concerned. Then, the unnecessary electric charges are swept (reset) by the sweep scanning system, thereby carrying out a so-called electronic shutter operation. Here, the electronic shutter operation means an operation for abandoning the electric charges accumulated in the photoelectric conversion portion to newly start the exposure (start the accumulation of the electric charges).

The signal read out by the reading operation by the read scanning system corresponds to the light quantity of received light by the last reading operation or in and after the electronic shutter operation. Then, a period of time ranging from either a reading timing by the last reading operation or a sweep timing by the electronic shutter operation to a reading timing by the current reading operation becomes a period of time for exposure for the electric charges in the unit pixel.

The signals output from the respective unit pixels of the pixel row which is selectively scanned by the vertical drive portion 12 are input to the column processing portion 13 through the respective vertical signal lines 17 every pixel column. The column processing portion 13 executes predetermined signal processing for the signals output through the respective vertical signal lines 17 from the pixels of the selected row every pixel column of the pixel array portion 11, and temporarily holds therein the pixel signals after the signal processing.

Specifically, the column processing portion 13 executes, as the signal processing, at least noise removal processing, for example, CDS (Correlated Double Sampling) processing or DDS (Double Data Sampling) processing. For example, by executing the CDS processing, reset noise and a fixed pattern noise peculiar to the pixel such as threshold value dispersion of an amplifying transistor within the pixel are removed away. The column processing portion 13 can be given, for example, an AD (analog-digital) conversion function in addition to the noise removal processing, and can convert the analog pixel signal into a digital signal, thereby outputting the resulting digital signal.

The horizontal drive portion 14 includes a shift register, an address decoder, and the like, and selects the unit circuits, in order, corresponding to the pixel column of the column processing portion 13. The selective scanning by the horizontal drive portion 14 results in that the pixel signals subjected to the signal processing every unit circuit in the column processing portion 13 are output in order.

The system control portion 15 includes a timing generator for producing various kinds of timing signals, and the like. The system control portion 15 carries out the drive control for the vertical drive portion 12, the column processing portion 13, the horizontal drive portion 14, and the like on the basis of the various kinds of timings produced by the timing generator concerned.

The signal processing portion 18 has at least an arithmetic operation processing function, and executes various pieces of signal processing such as arithmetic operation processing and the like for the pixel signals output from the column processing portion 13. The data storing portion 19, in executing the signal processing in the signal processing portion 18, temporarily stores therein the data necessary for that processing.

Example of Configuration of Pixel

Figure 2:
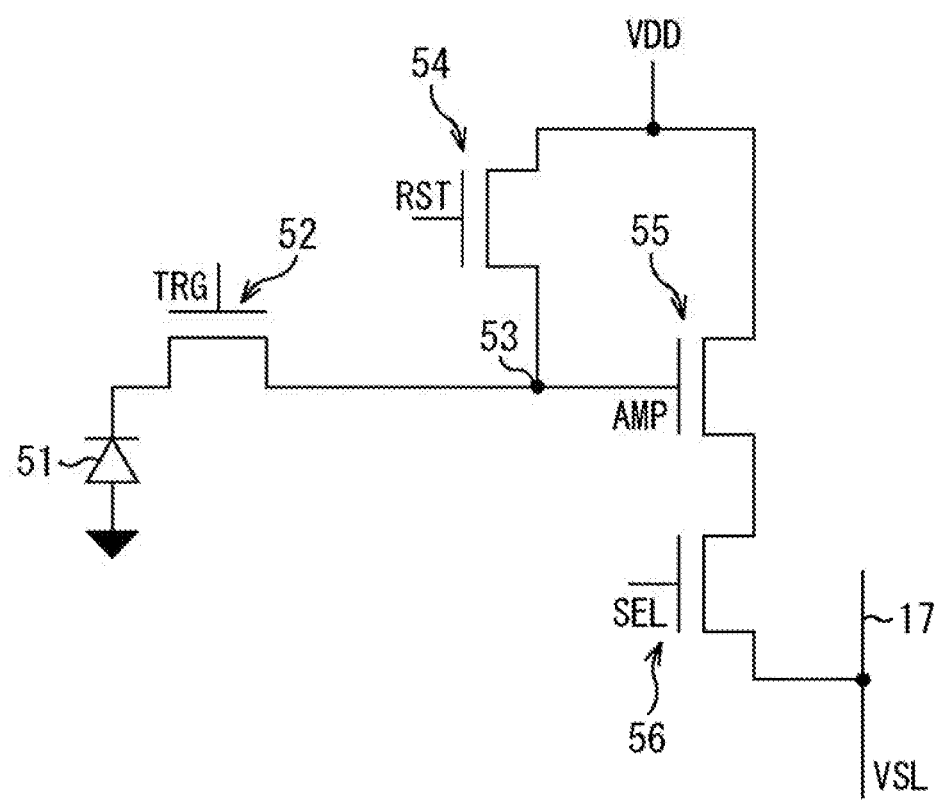
FIG. 2 is a circuit diagram depicting an example of a configuration of a pixel.

Next, a description will be given with respect to a configuration of each of the pixels in the pixel array portion 11 described above. FIG. 2 is a circuit diagram depicting an example of a configuration of one pixel provided in the pixel array portion 11.

In this example, the pixel of the pixel array portion 11 includes a photoelectric conversion element 51, a transfer gate portion 52, a charge-to-voltage converting portion 53, a reset gate portion 54, an amplifying transistor 55, and a selection transistor 56.

The photoelectric conversion element 51, for example, is composed of a PN junction photodiode, and receives light from a subject and produces the electric charges responding to the light quantity of received light through the photoelectric conversion to accumulate therein the resulting electric charges.

The transfer gate portion 52 is provided between the photoelectric conversion element 51 and the charge-to-voltage converting portion 53. The transfer gate portion 52 transfers the electric charges accumulated in the photoelectric conversion element 51 to the charge-to-voltage converting portion 53 in accordance with a drive signal TRG supplied to a gate electrode of the transfer gate portion 52.

For example, the transfer gate portion 52, the reset gate portion 54, and the selection transistor 56 are composed of an N-channel MOS transistor. Then, the drive signals TRG, RST, and SEL are supplied to the gate electrodes of the transfer gate portion 52 to the selection transistor 56. Each of these drive signals is a pulse signal a low level state of which becomes an active state (ON state), and a low level state of which becomes a non-active state (OFF state).

Therefore, for example, when in the transfer gate portion 52, the drive signal TRG supplied to the gate electrode of the transfer gate portion 52 becomes the active state to turn ON the transfer gate portion 52, the electric charges accumulated in the photoelectric conversion element 51 are transferred to the charge-to-voltage converting portion 53.

The charge-to-voltage converting portion 53 is a floating diffusion area (FD) in which the electric charges transferred thereto from the photoelectric conversion element 51 through the transfer gate portion 52 is converted into an electric signal, for example, a voltage signal and the resulting signal is output.

The reset gate portion 54 is connected to the charge-to-voltage converting portion 53, and the charge-to-voltage converting portion 53 is connected to the vertical signal line 17 through the amplifying transistor 55 and the selection transistor 56.

The reset gate portion 54 is an element for suitably initializing (resetting) the charge-to-voltage converting portion 53 and the like. A drain of the reset gate portion 54 is connected to a power source having a power source voltage VDD, and a source thereof is connected to the charge-to-voltage converting portion 53. The drive signal RST is applied as a reset signal to the gate electrode of the reset gate portion 54.

In addition, when the drive signal RST is set to the active state, the reset gate portion 54 becomes a conduction state, so that an electric potential at each of the charge-to-voltage converting portion 53 and the like is reset to a level of the power source voltage VDD. That is, the charge-to-voltage converting portion 53 and the like are initialized.

The gate electrode of the amplifying transistor 55 is connected to the charge-to-voltage converting portion 53, and a drain thereof is connected to a power source having the power source voltage VDD. Then, the amplifying transistor 55 becomes an input portion of a source follower circuit for reading out the electric charges obtained through the photoelectric conversion in the photoelectric conversion element 51. That is, the amplifying transistor 55 is connected in source thereof to the vertical signal line 17 through the selection transistor 56, thereby configuring, together with a constant current source connected to one end of the vertical signal line 17 and the source follower circuit.

The selection transistor 56 is connected between the source of the amplifying transistor 55 and the vertical signal line 17. The drive signal SEL is supplied as the selection signal to the gate electrode of the selection transistor 56. When the drive signal SEL is set to the active state, the selection transistor 56 becomes the conduction state, so that the pixel having the selection transistor 56 provided therein is set to the selection state. When the pixel is set to the selection state, the signal output from the amplifying transistor 55 is read out to the column processing portion 13 through the vertical signal line 17.

In addition, in the respective pixels, a plurality of drive lines is wired as the pixel drive lines 16 of FIG. 1, for example, every pixel row. Then, the drive signals TRG, RST, and SEL are supplied from the vertical drive portion 12 to the inside of the pixel through a plurality of drive lines as the pixel drive lines 16.

It should be noted that the pixel circuit of FIG. 2 is an example of the pixel circuit which can be used in the pixel array portion 11, and the pixel circuits having other configurations can also be used.

In addition, the respective pixels can also adopt a shared pixel structure. The shared pixel structure, for example, includes a plurality of photoelectric conversion elements, a plurality of transfer transistors, shared one charge-to-voltage converting portion, and other pixel transistors shared on one-by-one basis.

2. First Embodiment

Next, a description will be given with respect to a CMOS image sensor 10a as a first embodiment of the CMOS image sensor 10 of FIG. 1 with reference to FIG. 3 to FIG. 12.

Example of Structure of CMOS Image Sensor 10a

Figure 3:
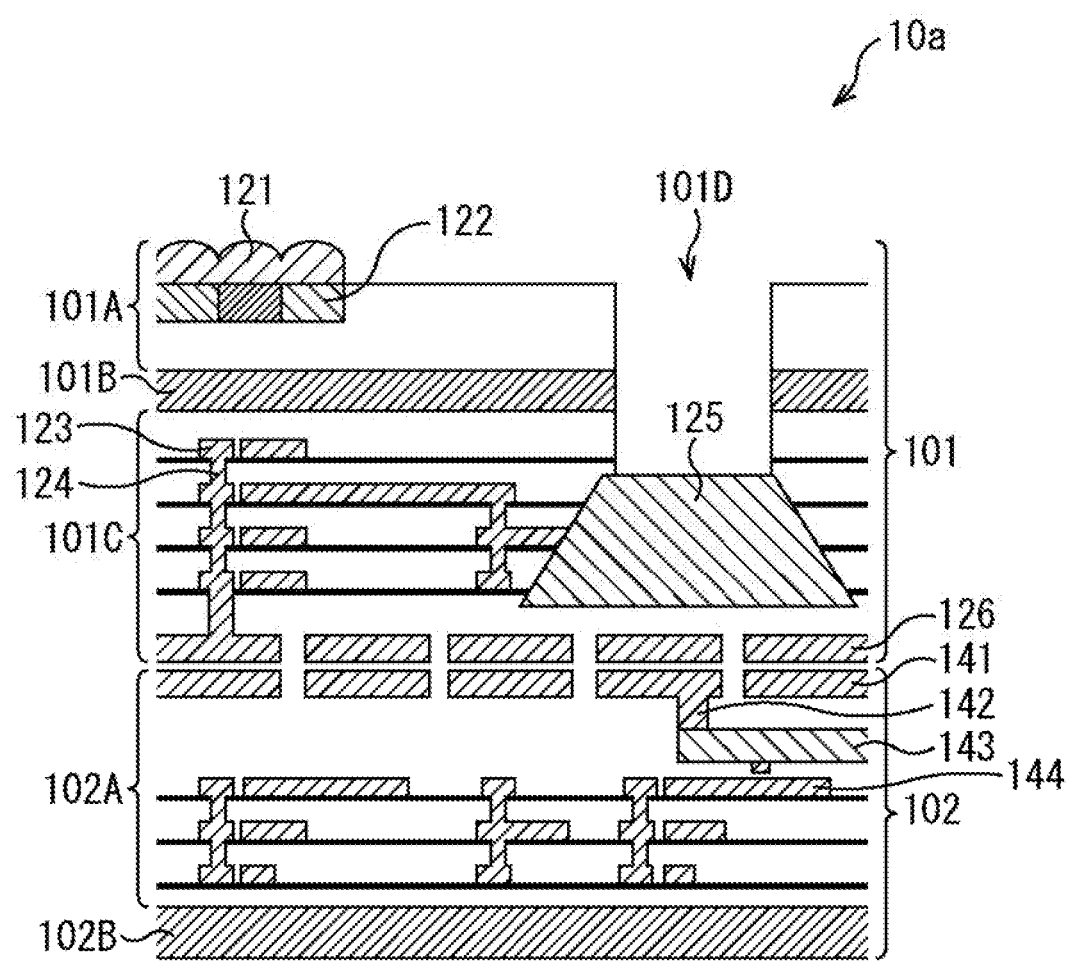
FIG. 3 is a cross-sectional view schematically depicting a first embodiment of a CMOS image sensor.

FIG. 3 is a cross-sectional view schematically depicting a part of an example of a structure of the CMOS image sensor 10a.

It should be noted that hereinafter, an incidence side of light (upper side of FIG. 3) is set as an upper side of the CMOS image sensor 10a, and a side (lower side of FIG. 3) opposite to the incidence side of light is set as a lower side of the CMOS image sensor 10a.

The CMOS image sensor 10a has a so-called back side illumination type structure in which the light is made incident to the CMOS image sensor 10a from a back surface side opposite to a front surface on a wiring layer 101C side of a pixel substrate 101. It should be noted that a back surface of the pixel substrate 101 is referred to as an incidence surface or a light receiving surface.

The CMOS image sensor 10a has a laminated back side illumination type structure in which a pixel substrate 101 and a control substrate 102 are laminated on each other. The pixel array portion 11 of FIG. 1, for example, is arranged in the pixel substrate 101. On the other hand, the vertical drive portion 12, the column processing portion 13, the horizontal drive portion 14, the system control portion 15, the signal processing portion 18, and the data storing portion 19, for example, are arranged in the control substrate 102.

It should be noted that a part of the vertical drive portion 12, the column processing portion 13, the horizontal drive portion 14, the system control portion 15, the signal processing portion 18, and the data storing portion 19 may be arranged in the pixel substrate 101. In addition, for example, the signal processing portion 18 and the data storing portion 19 may be arranged in a substrate different from the pixel substrate 101 and the control substrate 102.

In the pixel substrate 101, a light condensing layer 101A, a semiconductor layer 101B, and a wiring layer 101C are laminated in order from the upper side. Therefore, the light condensing layer 101A and the wiring layer 101C are arranged across the semiconductor layer 101B (with the semiconductor layer 101B as a reference) on sides opposite to each other.

An on-chip microlens 121, a color filter 122, and the like are formed in the light condensing layer 101A. Light made incident from an object to an upper surface (incidence surface) of the light condensing layer 101A is condensed on a photoelectric conversion element 51 (not depicted) formed in the semiconductor layer 101B by the on-chip microlens 121.

Although illustration is omitted, the semiconductor elements such as the photoelectric conversion element 51, the transfer gate portion 52, the charge-to-voltage converting portion 53, the reset gate portion 54, the amplifying transistor 55, and the selection transistor 56 are formed in the semiconductor layer 101B.

The wirings 123 are formed over four layers in the vertical direction in the wiring layer 101C. The wirings 123 of the layers are connected to one another through the via 124. The wirings 123 and the via 124, for example, are made of Cu.

In addition, a pad 125 for outside connection is formed in the wiring layer 101C. In this example, the pad 125 is arranged to have a height approximately equal to that of the wirings 123 from a second level to a fourth level of the wiring layer 101C, and a third level wiring 123 is connected to a side surface of the pad 125. A through hole 101D which completely extends through the light condensing layer 101A and the semiconductor layer 101B is formed above the pad 125. The formation of the through hole 101D results in that a part of a surface (hereinafter, referred to as a connection surface) on which a wire-bond ball of the pad 125 is formed is exposed.

Moreover, a pad 126 for joining to the control substrate 102 is formed on a lower end of the wiring layer 101C. The pad 126 is connected to the fourth level wiring 123 through the via 124. The pad 126, for example, is made of Cu.

A wiring layer 102A and a semiconductor layer 102B are laminated in order from the upper side in the control substrate 102. The control substrate 102 is laminated on the wiring layer 101C side of the pixel substrate 101, and the wiring layer 101C of the pixel substrate 101 and the wiring layer 102A of the control substrate 102 contact each other.

A pad 141 for joining to the pixel substrate 101 is formed in an upper end of the wiring layer 102A. The pad 141, for example, is made of Cu. Although in FIG. 3, for the sake of clarification of the figure, a gap is formed, the lower surface of the pad 126 of the pixel substrate 101, and the upper surface of the pad 141 of the control substrate 102 are Cu—Cu joined to each other. Therefore, in the CMOS image sensor 10a, the pad 126 and the pad 141 are not used for the outside connection, but function as the internal wirings.

In addition, an Al wiring 143 is formed in the wiring layer 102A. The Al wiring 143 is arranged between the pad 141 of the wiring layer 102A, and the first level wiring 144, and is connected to the pad 141 and the first level wiring 144 through the via 142. The via 142, for example, is made of Cu.

Moreover, the wirings 144 are formed over the three layers in the vertical direction in the wiring layer 102A. The wirings 144 of the layers are connected to one another through the via 142.

Although illustration is omitted, the control circuit configuring the vertical drive portion 12, the column processing portion 13, the horizontal drive portion 14, the system control portion 15, the signal processing portion 18, and the data storing portion 19 of FIG. 1, and the like are formed in the semiconductor layer 102B.

Then, the pad 125 of the pixel substrate 101 is connected to the control circuit of the semiconductor layer 102B of the control substrate 102 through the wiring 123, the via 124, and the pad 126 of the wiring layer 101C of the pixel substrate 101, and the pad 141, the via 142, the Al wiring 143, and the wiring 144 of the wiring layer 102A of the control substrate 102.

Method of Manufacturing CMOS Image Sensor 10a

Next, a description will be given with respect to a method of manufacturing the CMOS image sensor 10a with reference to FIG. 4 to FIG. 6.

Figure 4:
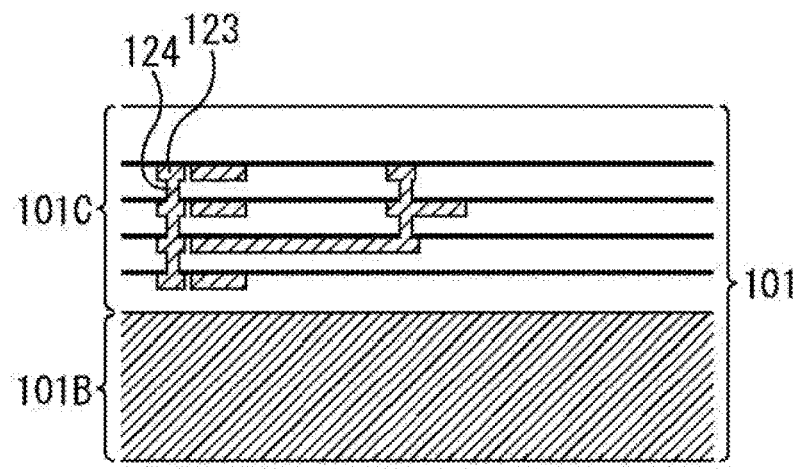
FIG. 4 is a view explaining a method of manufacturing the CMOS image sensor of FIG. 3.
Figure 4:
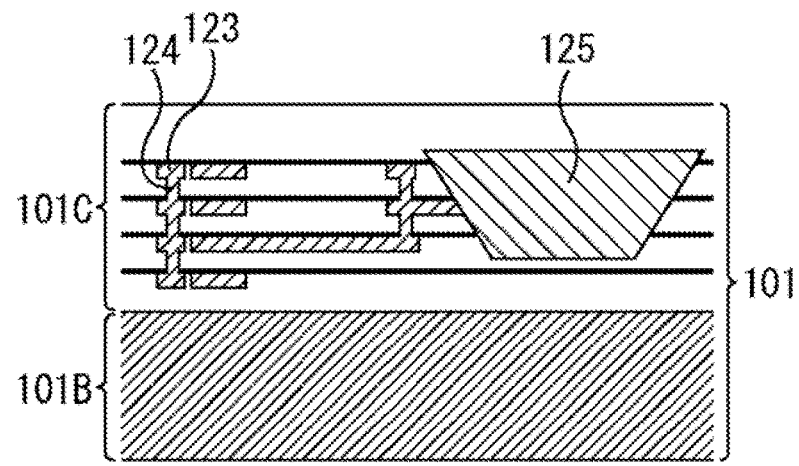
Figure 5:
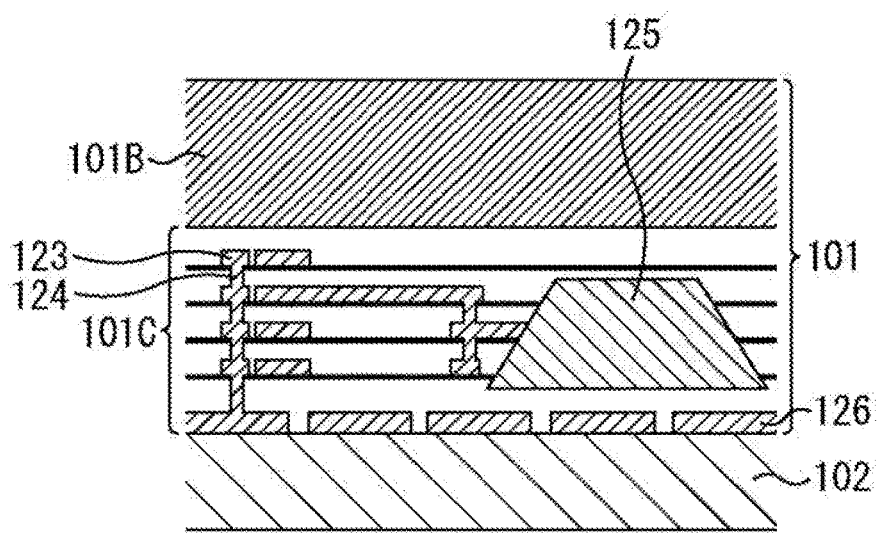
FIG. 5 is a view explaining the method of manufacturing the CMOS image sensor of FIG. 3.
Figure 5:
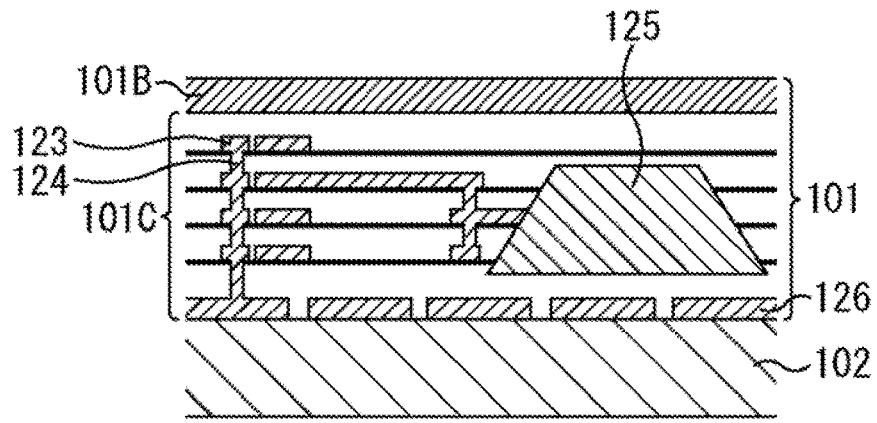

It should be noted that in a process 1 and a process 2 of FIG. 4, the vertical direction of the pixel substrate 101 is reversed to that of FIG. 3.

In the process 1, the semiconductor elements (not depicted) such as the photoelectric conversion element 51, the transfer gate portion 52, the charge-to-voltage converting portion 53, the reset gate portion 54, the amplifying transistor 55, and the selection transistor 56 are formed in the semiconductor layer 101B of the pixel substrate 101. In addition, the wiring 123 and the via 124 are formed in the wiring layer 101C of the pixel substrate 101.

It should be noted that since at this time point, the pad 125 is not yet formed, the limitation of the temperature is not caused in a high-temperature process for forming the semiconductor elements in the semiconductor layer 101B.

In addition, for example, a distance from the lower surface of the semiconductor layer 101B (the connection surface to the wiring layer 101C) to the wiring 123 of the uppermost layer of the wiring layer 101C is adjusted, thereby enabling a depth to which the pad 125 is to be filled to be freely adjusted. The depth to which the pad 125 is to be filled, for example, is determined from a viewpoint of a withstanding voltage and a capacity between the pad 125 and the semiconductor layer 101B, a damage applied to the wiring and an interlayer film under the pad 125 in a wire bonding process, and the like.

In the process 2, the pad 125 is filled in the wiring layer 101C of the pixel substrate 101. It should be noted that the details of a process for manufacturing the pad 125 will be described later.

It should be noted that a relative depth of the pad 125 with respect to the wiring 123 can be arbitrarily set. For example, although in this example, the connection surface (the lower surface in FIG. 4) of the pad 125 is arranged in a deeper position (a position located far from the semiconductor layer 101B) than the first level wiring 123, the connection surface of the pad 125 can also be arranged in a shallower position (a position close to the semiconductor layer 101B) than the first level wiring 123.

In addition, although the illustration is omitted, after the pad 125 is filled in the wiring layer 101C, the pad 126 and the via 124 through which the pad 126 is to be connected to the wiring 123 are formed in the upper end in the figure of the wiring layer 101C.

In a process 3, the pixel substrate 101 and the control substrate 102 are joined to each other. Specifically, a wafer (not depicted) in which the pixel substrate 101 is formed is reversed to be joined to a wafer (not depicted) in which the control substrate 102 is formed. As a result, the lower surface of the wiring layer 101C of the pixel substrate 101, and the control substrate 102 are joined to each other.

In a process 4, the semiconductor layer 101B of the pixel substrate 101 is thinned.

In a process 5, the light condensing layer 101A is formed on the semiconductor layer 101B of the pixel substrate 101.

The on-chip microlens 121, the color filter 122, and the like are formed in the light condensing layer 101A.

It should be noted that since at this time point, the through hole 101D is not yet formed, the undulation is hardly present on the upper surface of the semiconductor layer 101B. Therefore, in the process 5, the coating film composing the light condensing layer 101A can be readily uniformly applied, so that the surface irregularity of the thickness of the coating film can be suppressed. As a result, it is possible to suppress that the light condensing characteristics become worse.

In addition, although in the process 5, the low-temperature process is required because an organic material system is used, since the pad 125 is previously formed, and thus the formation of the pad 125 is not carried out, the lamination of the temperature is not caused in the low-temperature process.

In a process 6, the though hole 101D is formed in the pixel substrate 101. The though hole 101D completely extends through the light condensing layer 101A and the semiconductor layer 101B of the pixel substrate 101 to reach the connection surface of the pad 125. As a result, a part of the connection surface of the pad 125 is exposed.

After that, for example, a wire bond ball (not depicted) is formed on the connection surface of the pad 125. In addition, the wafer in which the pixel substrate 101 is formed, and the wafer in which the control substrate 102 is formed are laminated on each other is separated, thereby forming the CMOS image sensor 10a.

Details of Process for Manufacturing Pad 125

Next, a description will be given with respect to a detailed example of the process for manufacturing the pad 125 in the process 2 of FIG. 5 with reference to FIG. 7 to FIG. 11.

It should be noted that in FIG. 7 to FIG. 11, the vertical direction of the pixel substrate 101 is reversed to that of FIG. 3. In addition, in FIG. 7 to FIG. 11, for the sake of clarification of the figures, a portion in the vicinity of the pad 125 is enlarged to be depicted, and a description of a part of reference symbols of the portions is omitted.

First Example of Process for Manufacturing Pad 125

Figure 7:
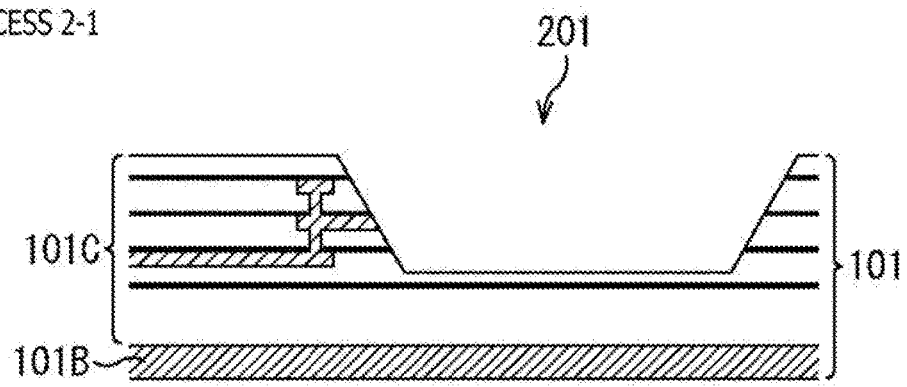
FIG. 7 is a view explaining a first example of processes for manufacturing a pad.
Figure 7:
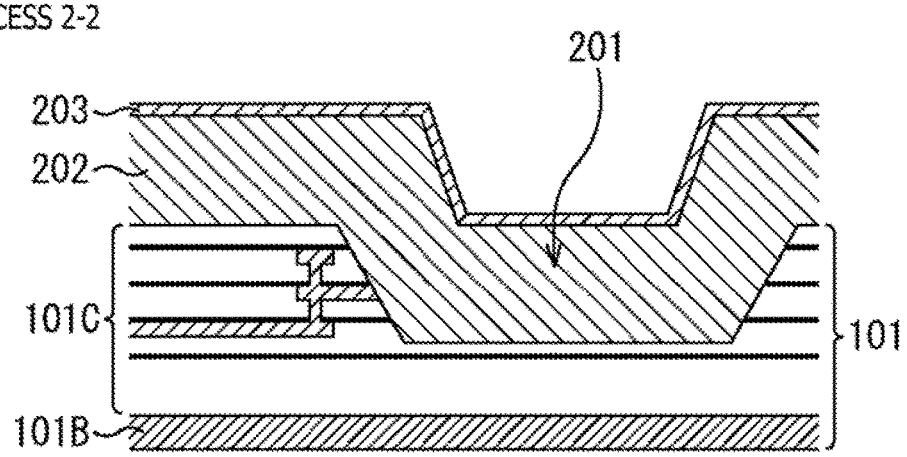

Firstly, a description will be given with respect to a first example of a process for manufacturing the pad 125 with reference to FIG. 7 and FIG. 8.

In a process 2-1, a trench 201 is formed in the wiring layer 101C of the pixel substrate 101. The trench 201 is formed to a depth to which the connection surface of the pad 125 is to be formed.

In a process 2-2, an Al film 202 for formation of the pad 125 is deposited on the lower surface (a surface opposite to the semiconductor layer 101B) of the wiring layer 101C of the pixel substrate 101. The Al film 202 covers the entire lower surface of the wiring layer 101C, and is filled in the trench 201. In addition, a barrier metal 203 is deposited on the surface of the Al film 202.

In a process 2-3a, a resist agent is applied to the surface of the barrier metal 203 and a resist film 204 is deposited.

In a process 2-4a, etching is carried out. Specifically, firstly, the resist film 204 is etched until the surface of the Al film 202 is exposed. A portion in which the trench 201 is not formed of the resist film 204 is thinner than a portion thereof in which the trench 201 is formed. Therefore, the surface of the Al film 202 of the portion in which the trench 201 is not formed is exposed.

Next, at a time point when the surface of the Al film 202 is exposed, the etching for the resist film 204 is stopped, and the Al film 202 is etched. Then, at a time point when a surface of an oxide film (the lower surface of the wiring layer 101C) of a portion other than the trench 201 of the wiring layer 101C is exposed, the etching for the Al film 202 is stopped, and the resist film 204 is etched. As a result, as depicted in the figure of the process 2-4a, only the Al film 202 within the trench 201 is left, thereby forming the pad 125.

In a process 2-5a, an oxide film 205 is deposited on the lower surface of the wiring layer 101C as the preparation for the joining to the control substrate 102. As a result, the pad 125 is filled in the wiring layer 101C.

Second Example of Process for Manufacturing Pad 125

Figure 9:
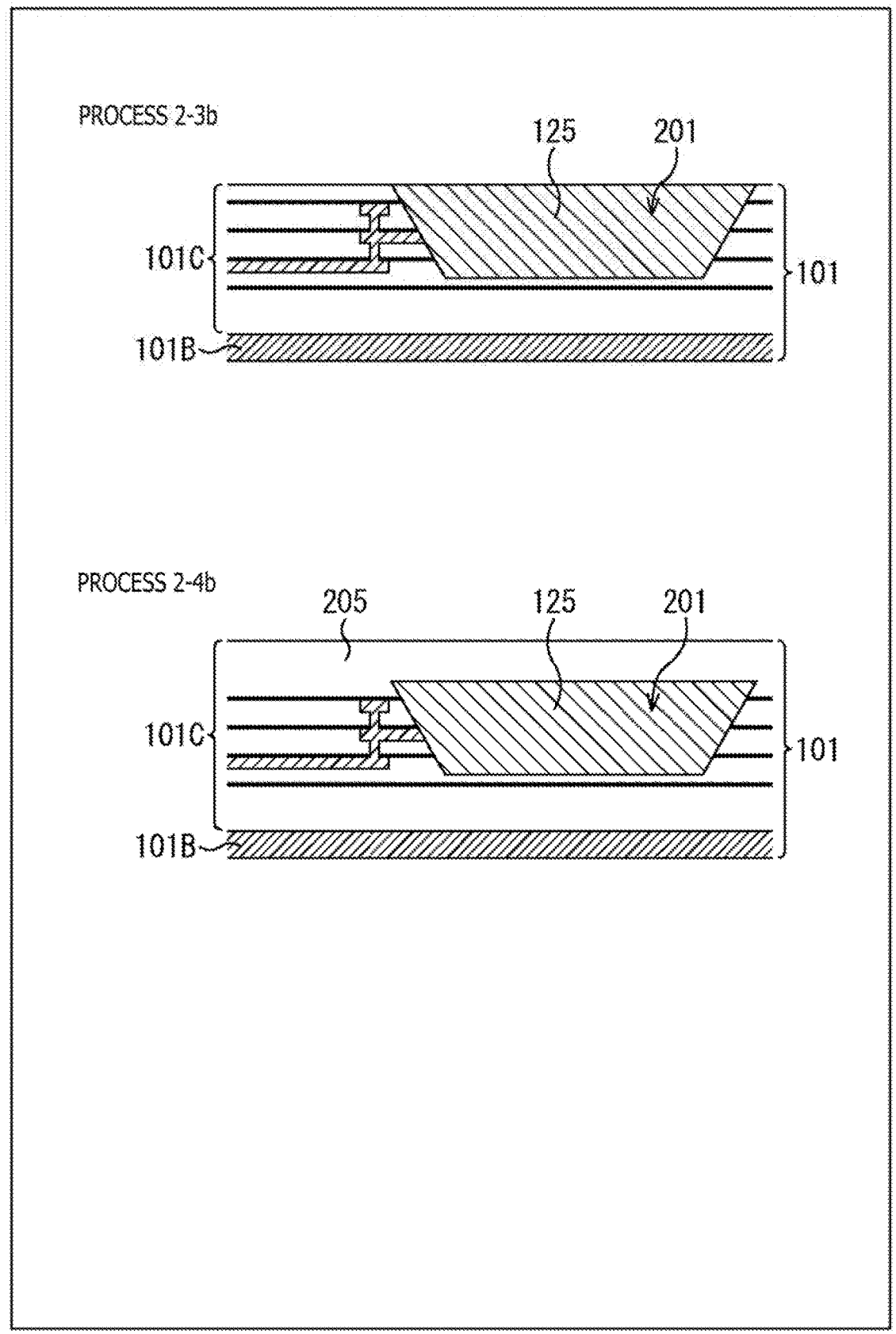
FIG. 9 is a view explaining a second example of processes for manufacturing a pad.

Next, a description will be given with respect to a second example of the process for manufacturing the pad 125 with reference to FIG. 9.

Firstly, the process 2-1 and process 2-2 described above with reference to FIG. 7 are carried out.

Next, in a process 2-3b, the Al film 202 is polished by using a CMP (Chemical Mechanical Polishing) process. As a result, the portion of the Al film 202 other than the portion of the Al film 202 within the trench 201 is removed away, thereby forming the pad 125.

Figure 8:
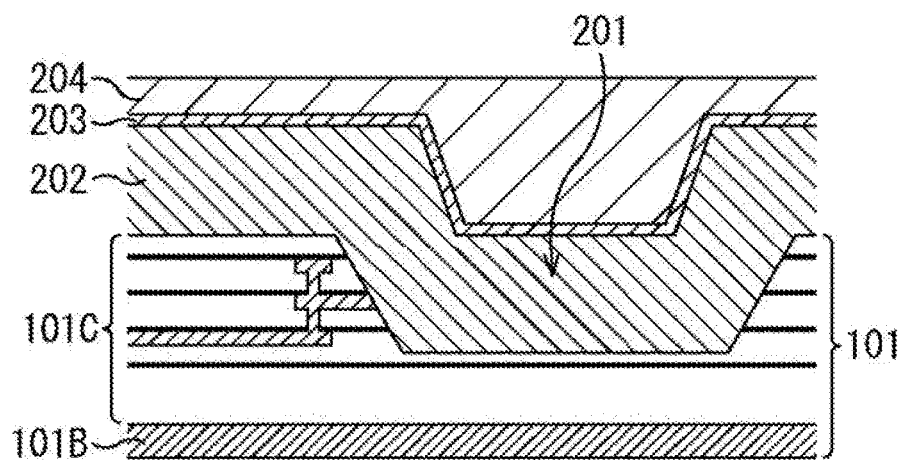
FIG. 8 is a view explaining the first example of the processes for manufacturing a pad.
Figure 8:
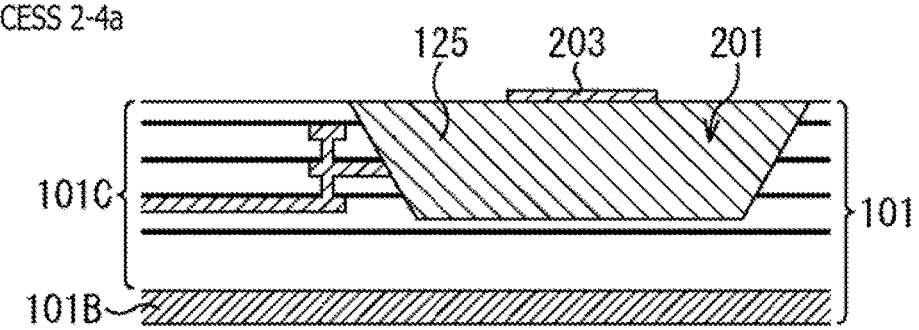
Figure 8:
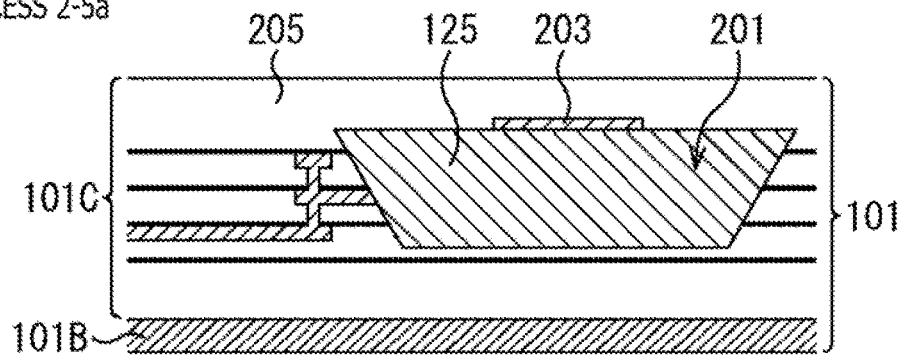

In a process 2-4b, similarly to the case of the process 2-5a of FIG. 8, the oxide film 205 is deposited on the lower surface of the wiring layer 101C as the preparation for the joining to the control substrate 102.

Third Example of Process for Manufacturing Pad 125

Figure 10:
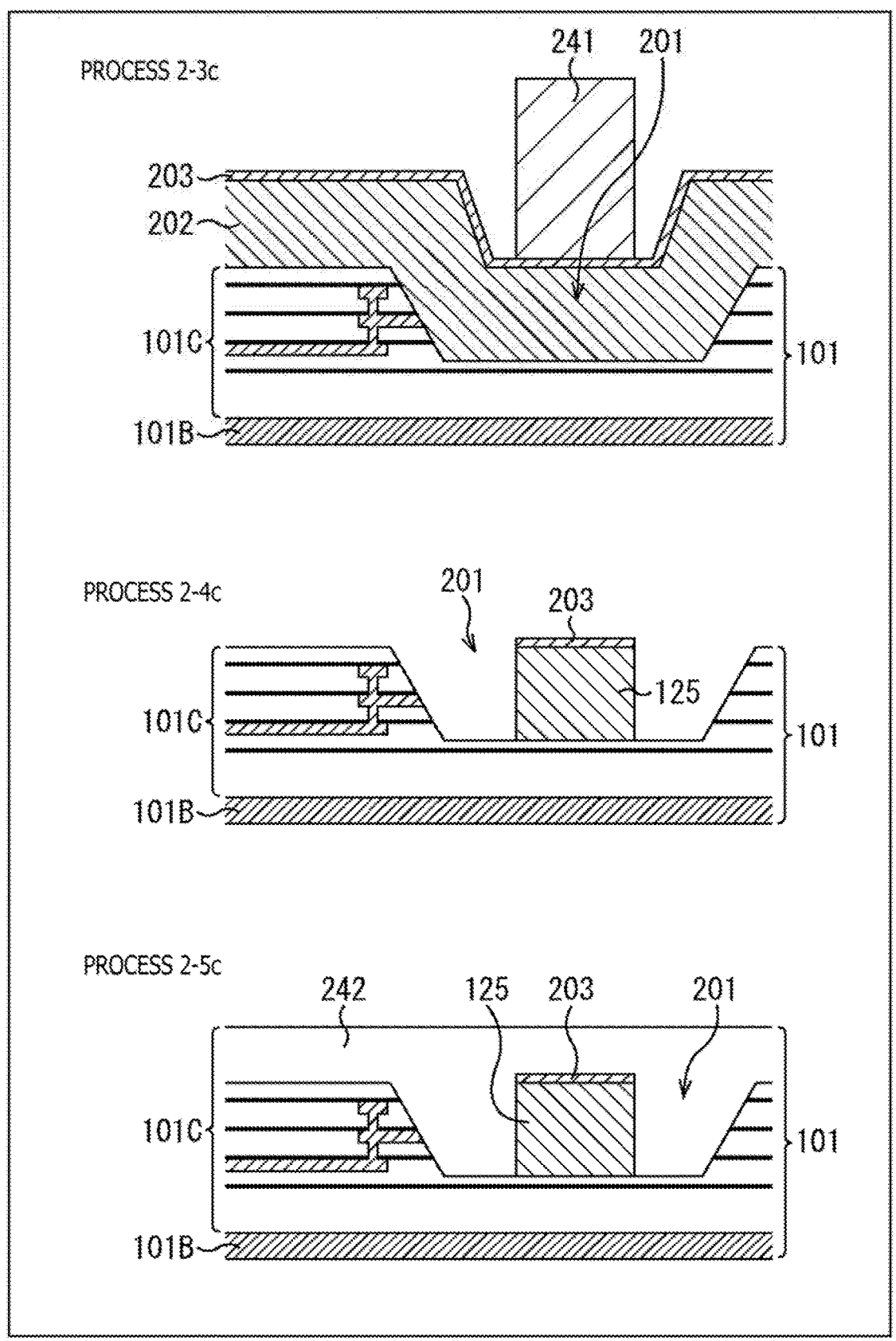
FIG. 10 is a view explaining a third example of processes for manufacturing a pad.

Next, a description will be given with respect to a third example of the process for manufacturing the pad 125 with reference to FIG. 10.

Firstly, the process 2-1 and process 2-2 described above with reference to FIG. 7 are carried out.

Next, in a process 2-3c, a resist film 241 is deposited. At this time, the resist film 241 is formed only in an area in which the pad 125 is to be formed.

In a process 2-4c, the Al film 202 is etched. As a result, the portion of the Al film 202 other than the portion of the Al film 202 in which the resist film 241 is to be formed is removed away. Next, the resist film 241 is etched, so that the resist film 241 is removed away. As a result, as depicted in a figure of a process 2-4c, the pad 125 is formed within the trench 201. At this time, the pad 125 is not filled in the entire trench 201, but has a shape responding to a shape of the resist film 241.

In a process 2-5c, the oxide film 242 is deposited on the lower surface of the wiring layer 101C as the preparation for the joining to the control substrate 102. As a result, the pad 125 is filled in the wiring layer 101C. In addition, a gap of the trench 201 is filled with the oxide film 242. Then, the surface of the oxide film 242 is planarized by using the CMP process.

Fourth Example of Process for Manufacturing Pad 125

Figure 11:
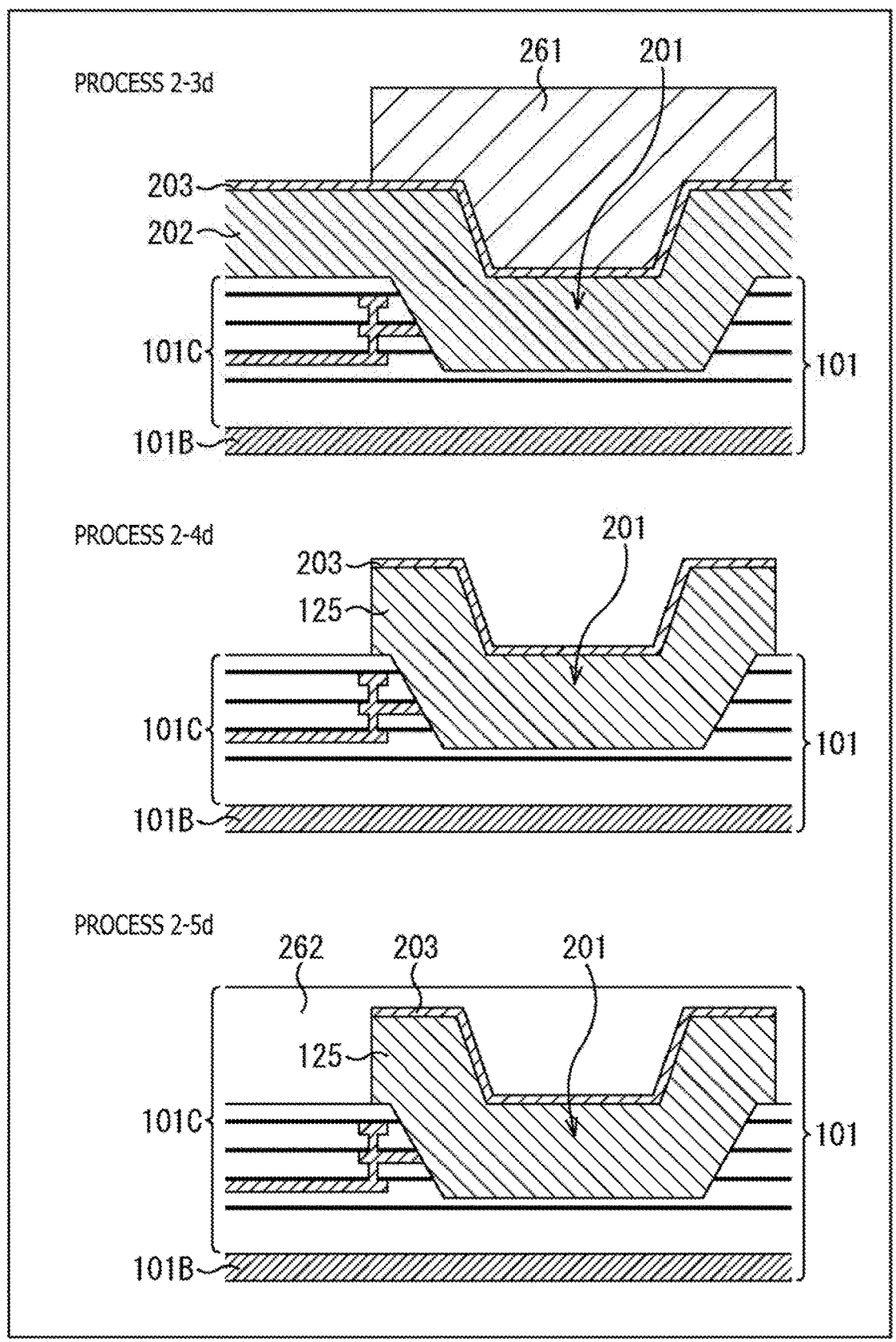
FIG. 11 is a view explaining a fourth example of processes for manufacturing a pad.

Next, a description will be given with respect to a fourth example of the process for manufacturing the pad 125 with reference to FIG. 11. This fourth example is such that as compared with the case of the third example, a pad 125 is formed in the outside as well of the trench 201.

Firstly, the process 2-1 and process 2-2 described above with reference to FIG. 7 are carried out.

Next, in a process 2-3d, a resist film 261 is deposited. At this time, the resist film 261 is formed only in an area in which the pad 125 is to be formed.

In a process 2-4d, the Al film 202 is etched. As a result, a portion of the Al film 202 other than a portion of the Al film 202 in which the resist film 241 is formed is removed away. Next, the resist film 241 is etched, so that the resist film 241 is removed away. As a result, as depicted in a figure of the process 2-4d, the pad 125 is formed in the trench 201 and the periphery of the trench 201.

In a process 2-5d, an oxide film 262 is deposited on the lower surface of the wiring layer 101C as the preparation for the joining to the control substrate 102. As a result, the pad 125 is filled in the wiring layer 101C. Then, the surface of the oxide film 262 is planarized by using the CMP process.

Example of Connection of Pad 125

Next, a description will be given with respect to an example of connection of the pad 125 with reference to FIG. 12. A of FIG. 12 and B of FIG. 12 are views when the neighborhood of the pad 125 of the pixel substrate 101 is viewed from the upper side.

Figure 12:
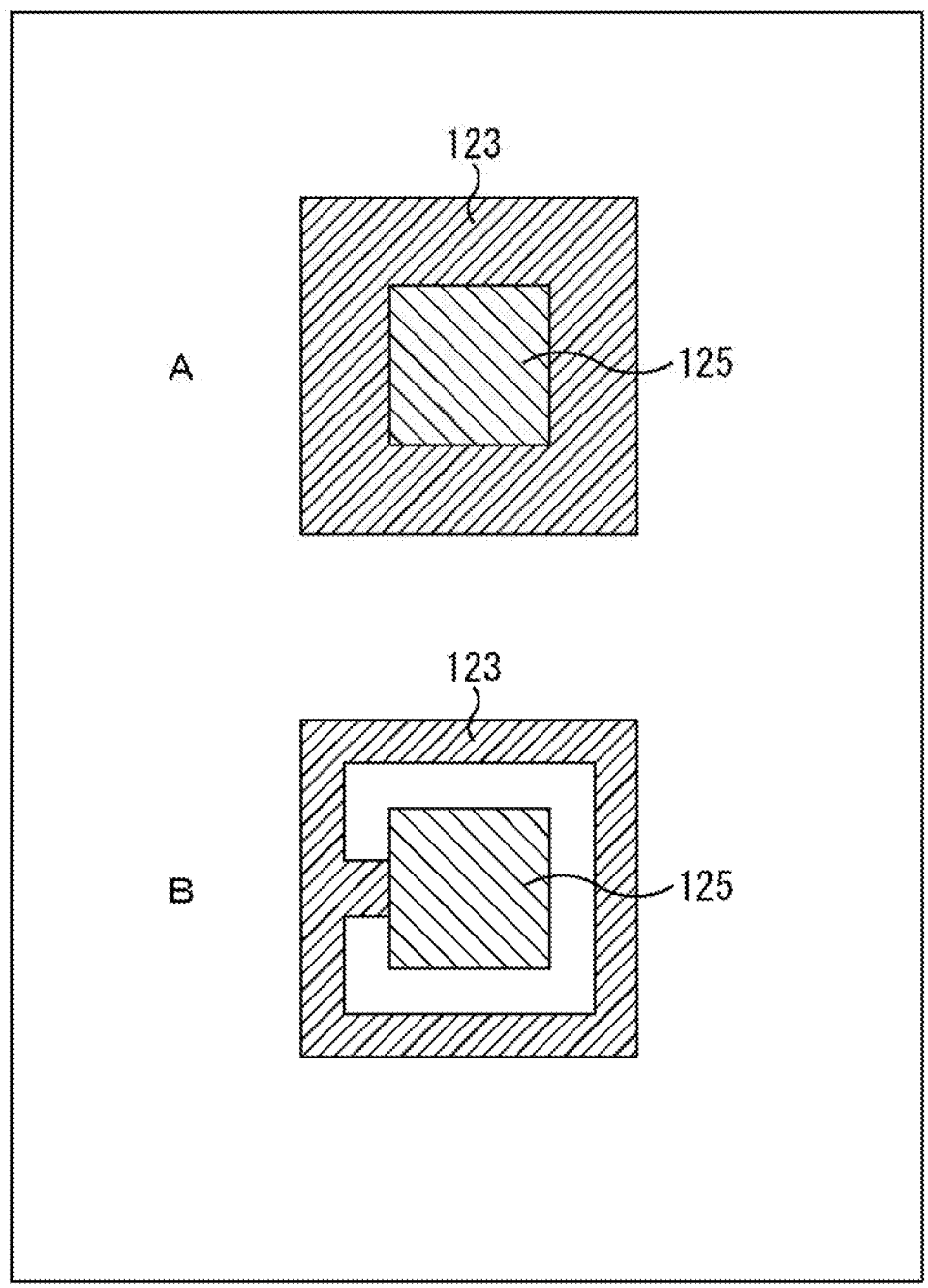
FIG. 12 is a view depicting an example of connection of the pad of the CMOS image sensor of FIG. 3.

For example, as depicted in A of FIG. 12, at an arbitrary height of the side surface of the pad 125, the wiring 123 may be made to contact the pad 125 so as to surround the side surface of the pad 125.

In addition, for example, as depicted in B of FIG. 12, at an arbitrary height of the side surface of the pad 125, the wiring 123 may surround the side surface of the pad 125, and the wiring 123 may also be made to contact only a part of the side surface of the pad 125.

It should be noted that a position where the wiring 123 contacts the pad 125 is not necessarily one position, and thus may be two or more portions. In addition, the position or number by which the wiring 123 contacts the pad 125, the wiring 123 of which of the layers is made to contact the pad 125, and so forth, for example, are determined from a viewpoint of a resistance value, a capacity, the reliability, and the like.

In the manner as described above, the pad 125 can be formed in the suitable position while the reduction of the quality of the back side illumination type CMOS image sensor 10a is suppressed.

For example, the pad 125 can be formed in a position at the depth of approximately 10 μm or less from the light receiving surface of the pixel substrate 101 of the CMOS image sensor 10a. As a result, the tip of the wire bond ball formed on the pad 125 is sufficiently exposed from the light receiving surface of the pixel substrate 101, so that the tests for the various kinds of assembly processes become easy to carry out.

Figure 6:
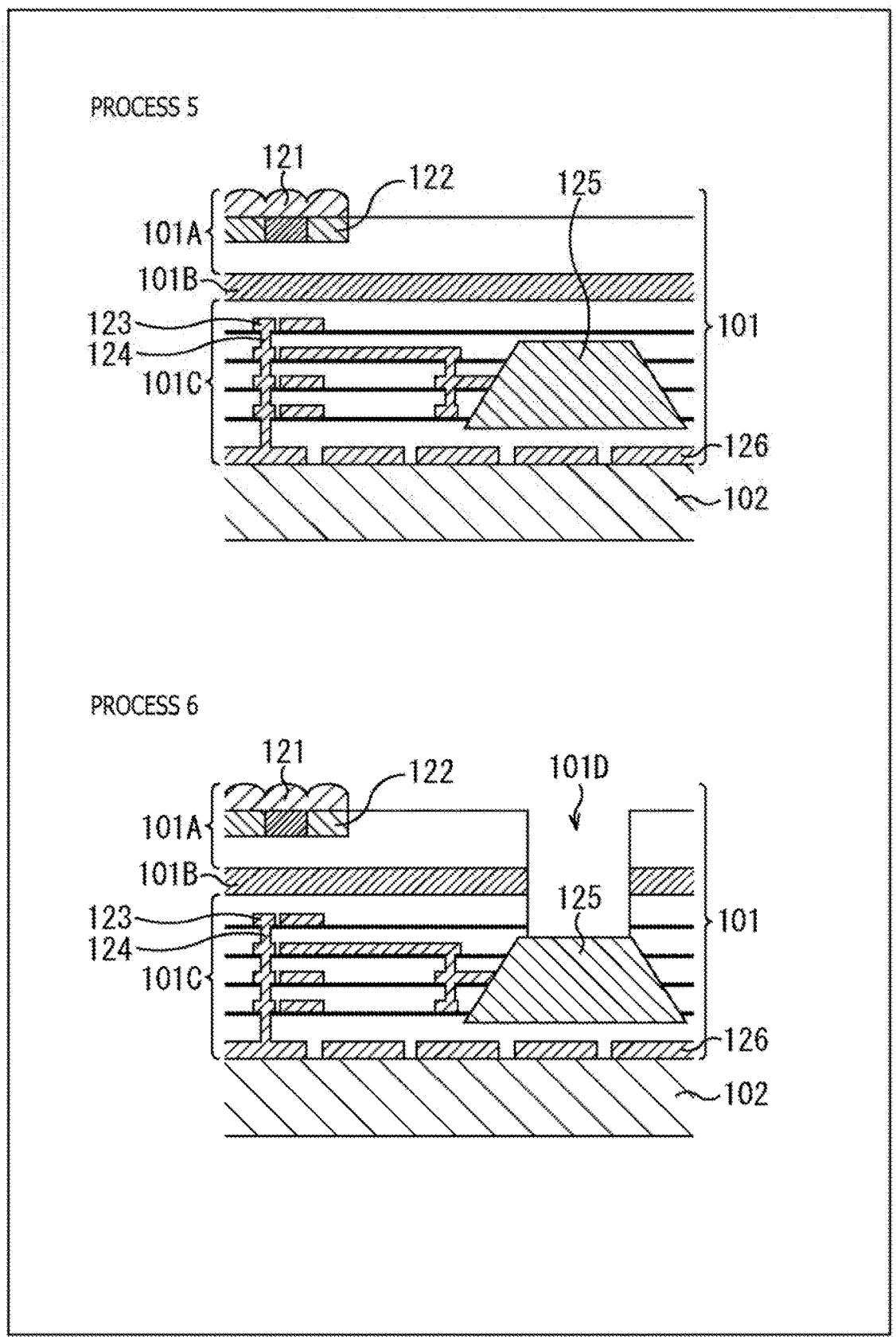
FIG. 6 is a view explaining the method of manufacturing the CMOS image sensor of FIG. 3.

In addition, as depicted above, in the process 5 of FIG. 6, the surface irregularity of the thickness of the coating film can be suppressed, and thus it is possible to suppress that the light condensing characteristics become worse.

Moreover, as described above, the limitation of the temperature is not caused in the high-temperature process at the time of formation of the semiconductor elements of the process 1 of FIG. 4, and in the low-temperature process at the time of formation of the light condensing layer 101A of the process 5 of FIG. 6. Therefore, the reduction of the characteristics of the CMOS image sensor 10a can be suppressed.

3. Second Embodiment

Next, a description will be given with respect to a CMOS image sensor 10b as a second embodiment of the CMOS image sensor 10 of FIG. 1 with reference to FIG. 13 and FIG. 14.

Example of Structure of CMOS Image Sensor 10b

Figure 13:
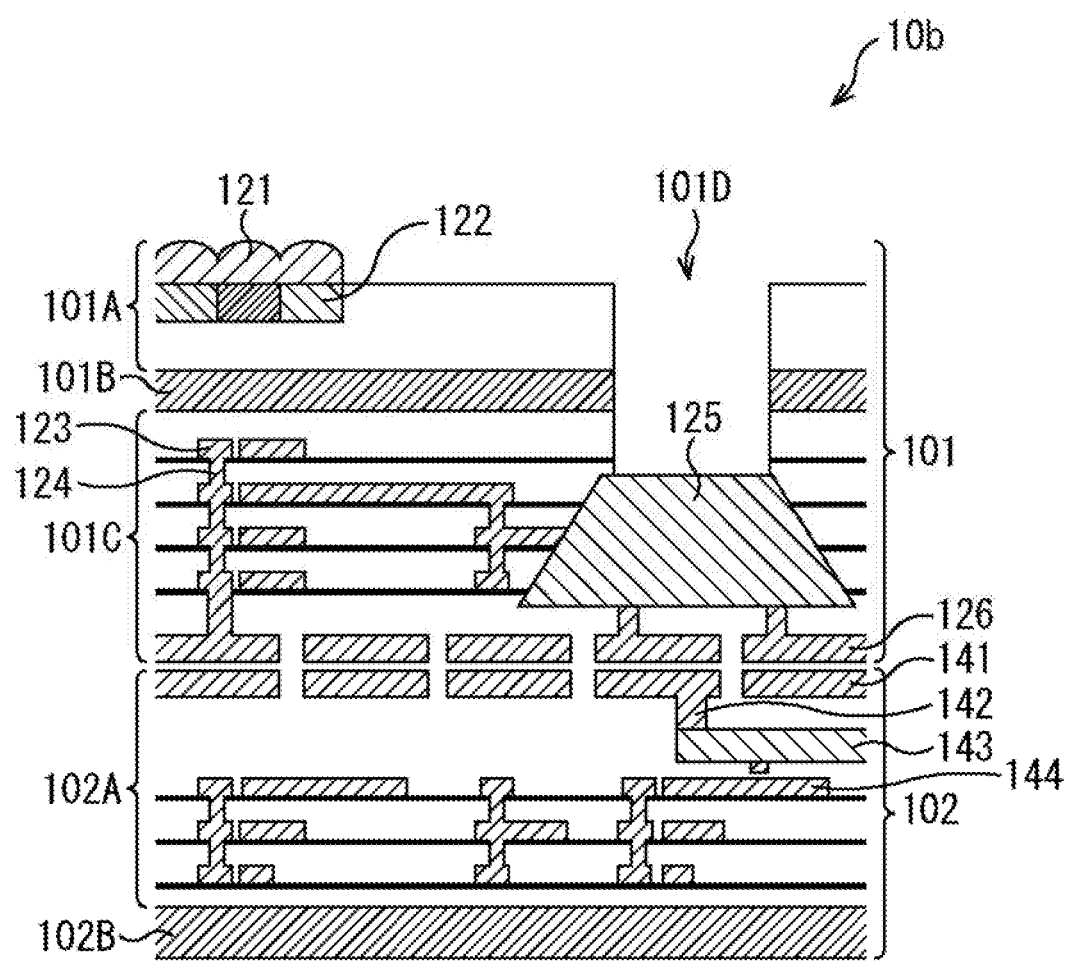
FIG. 13 is a cross-sectional view schematically depicting a second embodiment of a CMOS image sensor.

FIG. 13 is a cross-sectional view schematically depicting a part of an example of a structure of the CMOS image sensor 10b. It should be noted that portions corresponding to those of FIG. 3 are assigned the same reference symbols in the figure.

The CMOS image sensor 10b is different from the CMOS image sensor 10a of FIG. 3 in the method of connection of the pad 125. Specifically, in the CMOS image sensor 10b, the lower surface on a side opposite to the connection surface of the pad 125, and the upper surface of the pad 126 are connected to each other through the via 124.

Example of Connection of Pad 125

Next, a description will be given with respect to an example of connection of the pad 125 in the CMOS image sensor 10b with reference to FIG. 14. A of FIG. 14 and B of FIG. 14 are views when the neighborhood of the pad 125 of the pixel substrate 101 is viewed from the upper side.

Figure 14:
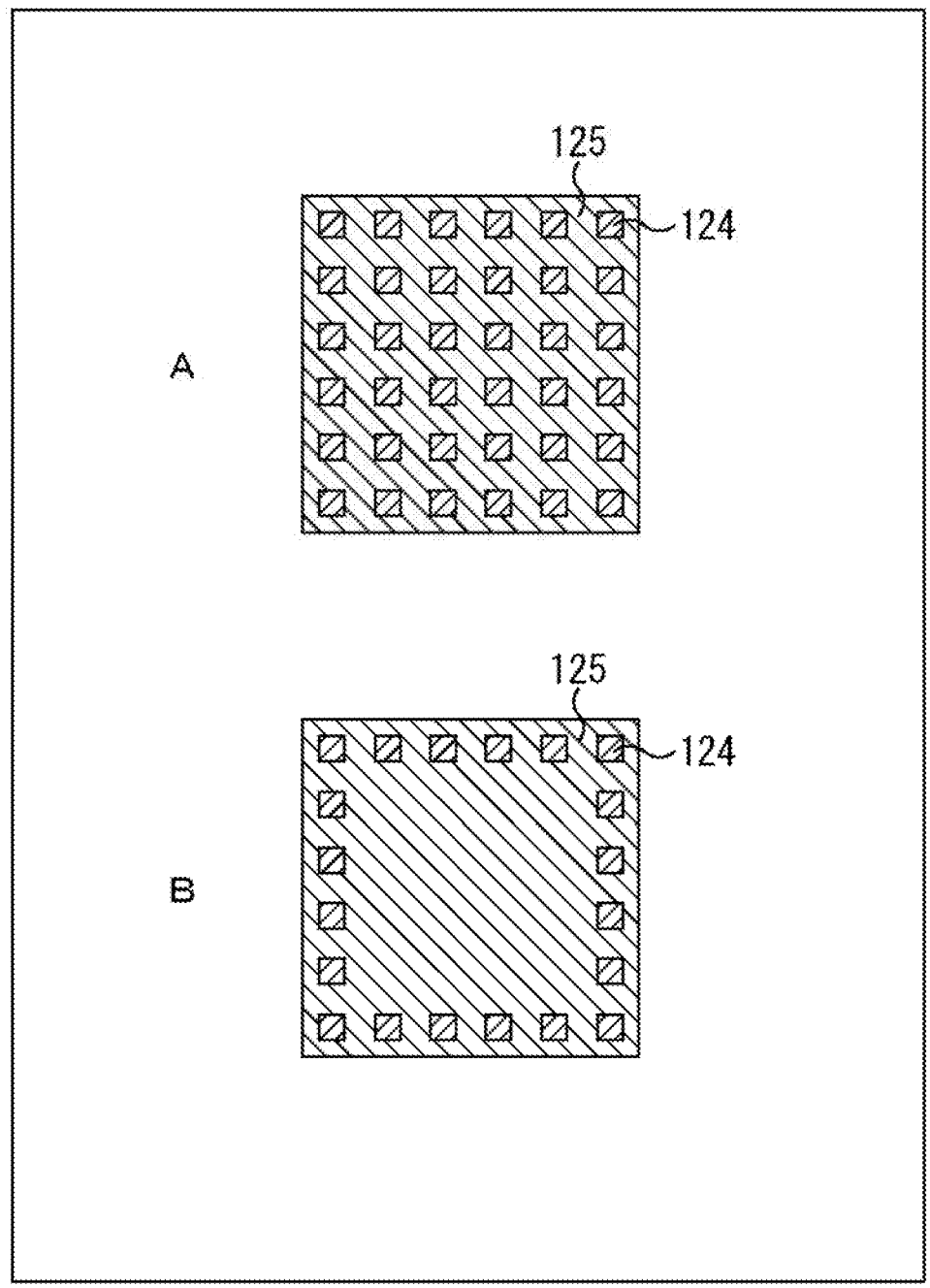
FIG. 14 is a view depicting an example of connection of a pad of the CMOS image sensor of FIG. 13.

For example, as depicted in A of FIG. 14, the vias 124 may be arranged on the entire lower surface of the pad 125, and thus the pad 125 may be connected to the pad 126.

In addition, for example, as depicted in B of FIG. 14, the vias 124 may be arranged only in the outer peripheral portion of the lower surface of the pad 125, and thus the pad 125 may be connected to the pad 126. In this case, reduction in the number of vias 124 results in that the damage applied to the pad 125 in forming the via 124 can be alleviated.

It should be noted that the number or positions of the vias 124 which are to be connected to the pads 125, for example, is determined from a viewpoint of the resistance value, the capacity, the reliability, and the like.

4. Third Embodiment

Next, a description will be given with respect to a CMOS image sensor 10c as a third embodiment of the CMOS image sensor 10 of FIG. 1 with reference to FIG. 15 and FIG. 16.

Example of Structure of CMOS Image Sensor 10c

Figure 15:
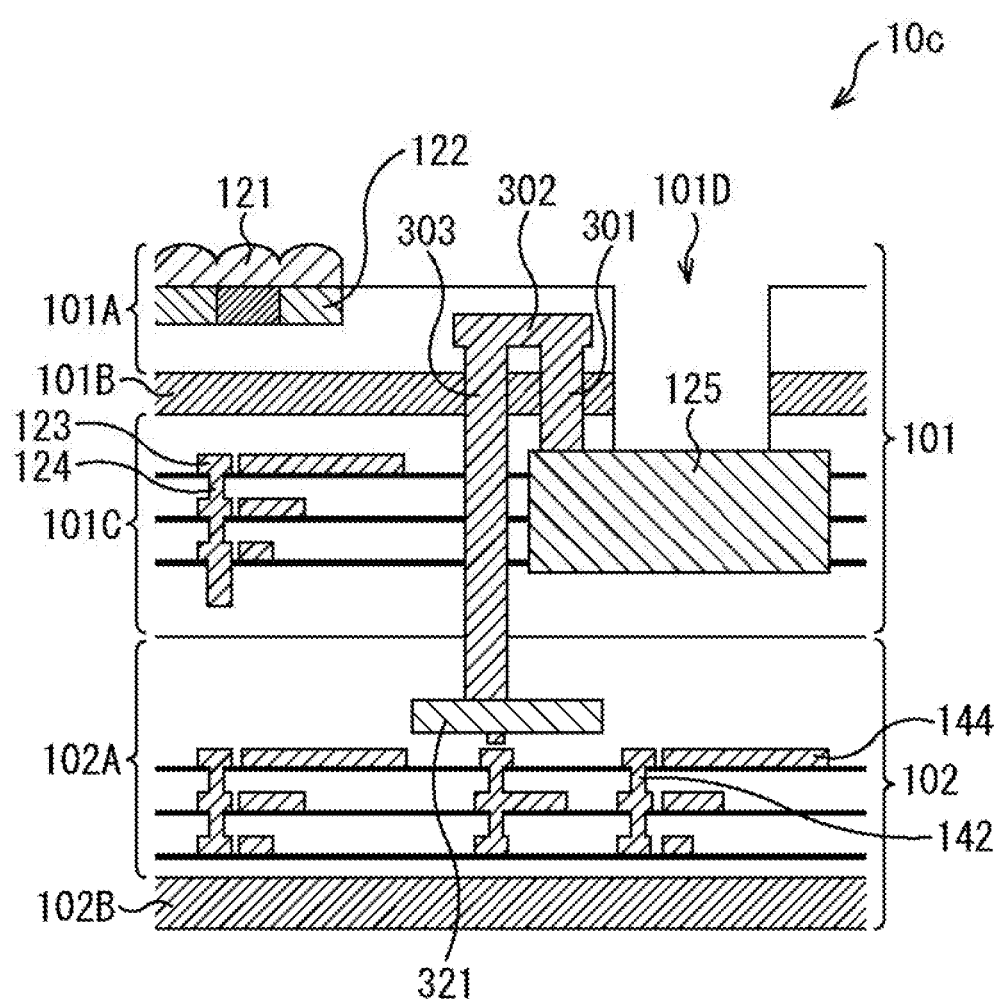
FIG. 15 is a cross-sectional view schematically depicting a third embodiment of a CMOS image sensor.

FIG. 15 is a cross-sectional view schematically depicting a part of an example of a structure of the CMOS image sensor 10c. It should be noted that portions corresponding to those of FIG. 3 are assigned the same reference symbols in the figure.

The CMOS image sensor 10c is different from the CMOS image sensor 10a of FIG. 3 in the method of connection of the pad 125.

Specifically, in the CMOS image sensor 10c, the via 301 completely extends through the semiconductor layer 101B of the pixel substrate 101 to be connected to the connection surface of the pad 125. In addition, the via 303 completely extends through the semiconductor layer 101B and the wiring layer 101C of the pixel substrate 101 to be connected to the upper surface of the Al wiring 321 formed in the wiring layer 102A of the control substrate 102. For example, in the case where the semiconductor layer 101B is made of silicon, the via 301 and the via 303 are called a name of a silicon through electrode, a TSV (Through Silicon Via) or the like.

The via 301 and the via 303 are connected to each other through the wiring 302 in the light condensing layer 101A of the pixel substrate 101. Therefore, the connection surface of the pad 125, and the upper surface of the Al wiring 321 are connected to each other through the via 301, the wiring 302, and the via 303.

In addition, the oxide film of the wiring layer 101C of the pixel substrate 101, and the oxide film of the wiring layer 102A of the control substrate 102 are joined to each other, thereby joining the pixel substrate 101 and the control substrate 102 to each other.

Example of Connection of Pad 125

Next, referring to FIG. 16, a description will be given with respect to an example of connection of the pad 125 in the CMOS image sensor 10c. A of FIG. 16 and B of FIG. 16 are views when the neighborhood of the pad 125 of the pixel substrate 101 is viewed from the upper side.

Figure 16:
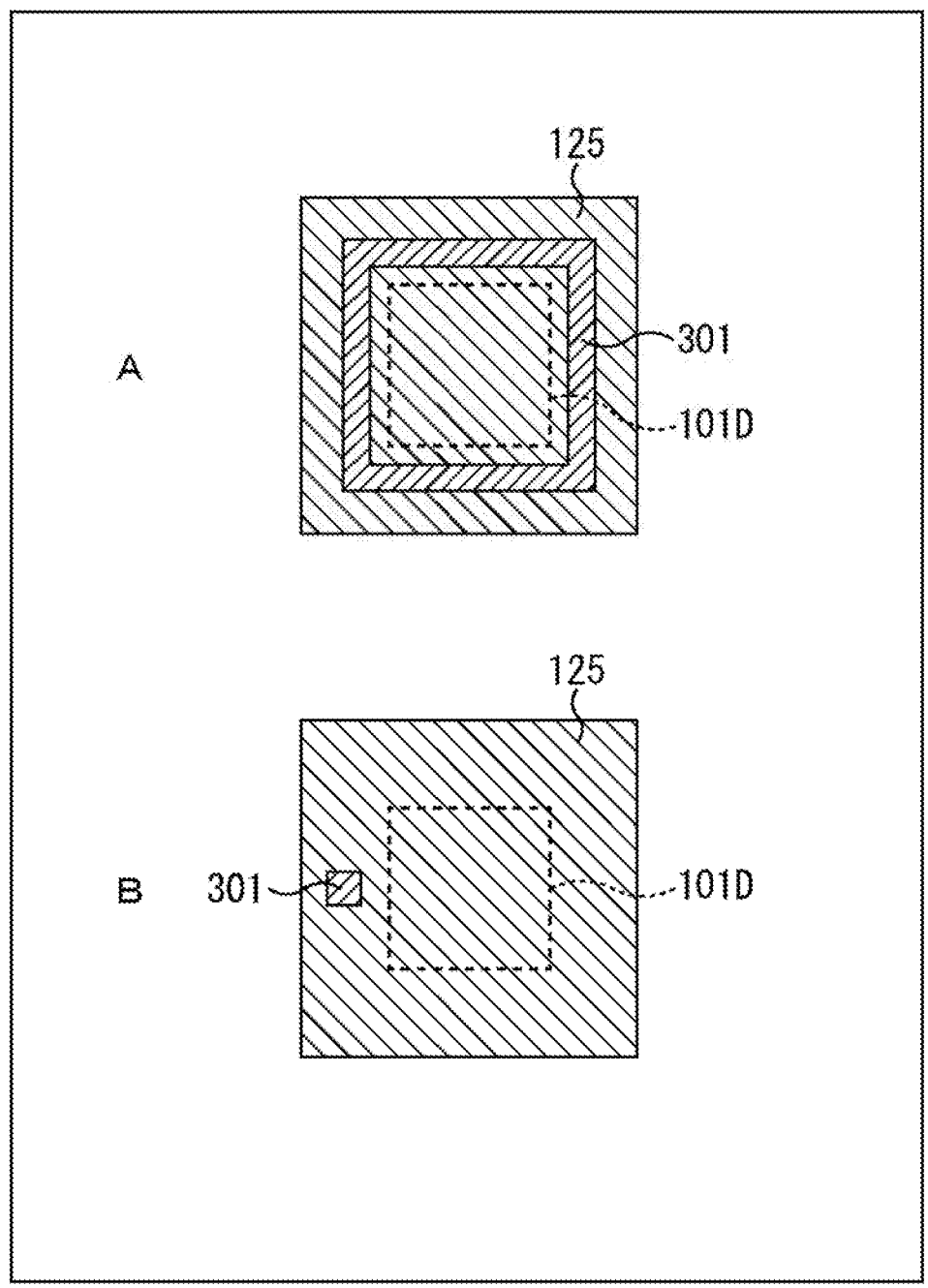
FIG. 16 is a view depicting an example of connection of a pad of the CMOS image sensor of FIG. 15.

For example, as depicted in A of FIG. 16, the via 301 may be connected to the upper surface of the pad 125 so as to surround the periphery of the portion exposed through the through hole 101D of the connection surface of the pad 125.

In addition, for example, as depicted in B of FIG. 16, the via 301 may be connected to a part of the periphery of the portion exposed through the through hole 101D of the connection surface of the pad 125.

It should be noted that the position where the via 301 is connected to the connection surface of the pad 125 can also be provided in two or more portions. In addition, the position or number by which the via 301 is connected to the connection surface of the pad 125, for example, is determined from a viewpoint of the resistance value, the capacity, the reliability, and the like.

In addition, for example, the via 303 can also be connected to the wiring 144 underlying the Al wiring 321 of the wiring layer 102A of the control substrate 102. In addition, the via 303 can also be connected to the wiring 144 of the wiring layer 102A of the control substrate 102 without providing the Al wiring 321.

5. Fourth Embodiment

Next, a description will be given with respect to a CMOS image sensor 10d as a fourth embodiment of the CMOS image sensor 10 of FIG. 1 with reference to FIG. 17 and FIG. 18.

Example of Structure of CMOS Image Sensor 10d

Figure 17:
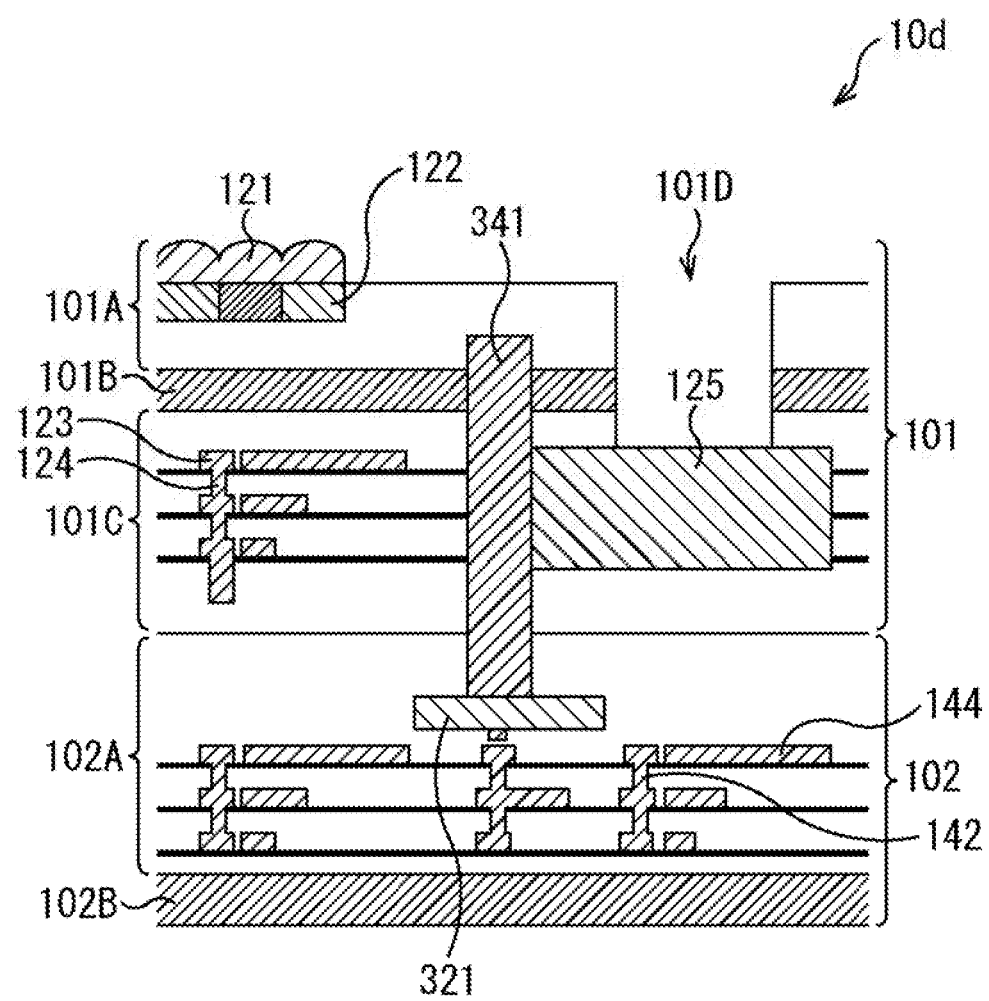
FIG. 17 is a cross-sectional view schematically depicting a fourth embodiment of a CMOS image sensor.

FIG. 17 is a cross-sectional view schematically depicting a part of an example of a structure of the CMOS image sensor 10d. It should be noted that portions corresponding to those of FIG. 15 are assigned the same reference symbols in the figure.

The CMOS image sensor 10d is different from the CMOS image sensor 10c of FIG. 15 in the method of connection of the pad 125.

Specifically, in the CMOS image sensor 10d, the via 341 completely extends through the semiconductor layer 101B and the wiring layer 101C of the pixel substrate 101 to be connected to the side surface of the pad 125 and the upper surface of the Al wiring 321. For example, in the case where the semiconductor layer 101B is made of silicon, the via 341 is called a name of a silicon through electrode, a TSV (Through Silicon Via) or the like. Then, the side surface of the pad 125 and the upper surface of the Al wiring 321 are connected to each other through the via 341, and this connection method is called a side contact, for example.

Example of Connection of Pad 125

Next, referring to FIG. 18, a description will be given with respect to an example of connection of the pad 125 in the CMOS image sensor 10d. A of FIG. 18 and B of FIG. 18 are views when the neighborhood of the pad 125 of the pixel substrate 101 is viewed from the upper side.

Figure 18:
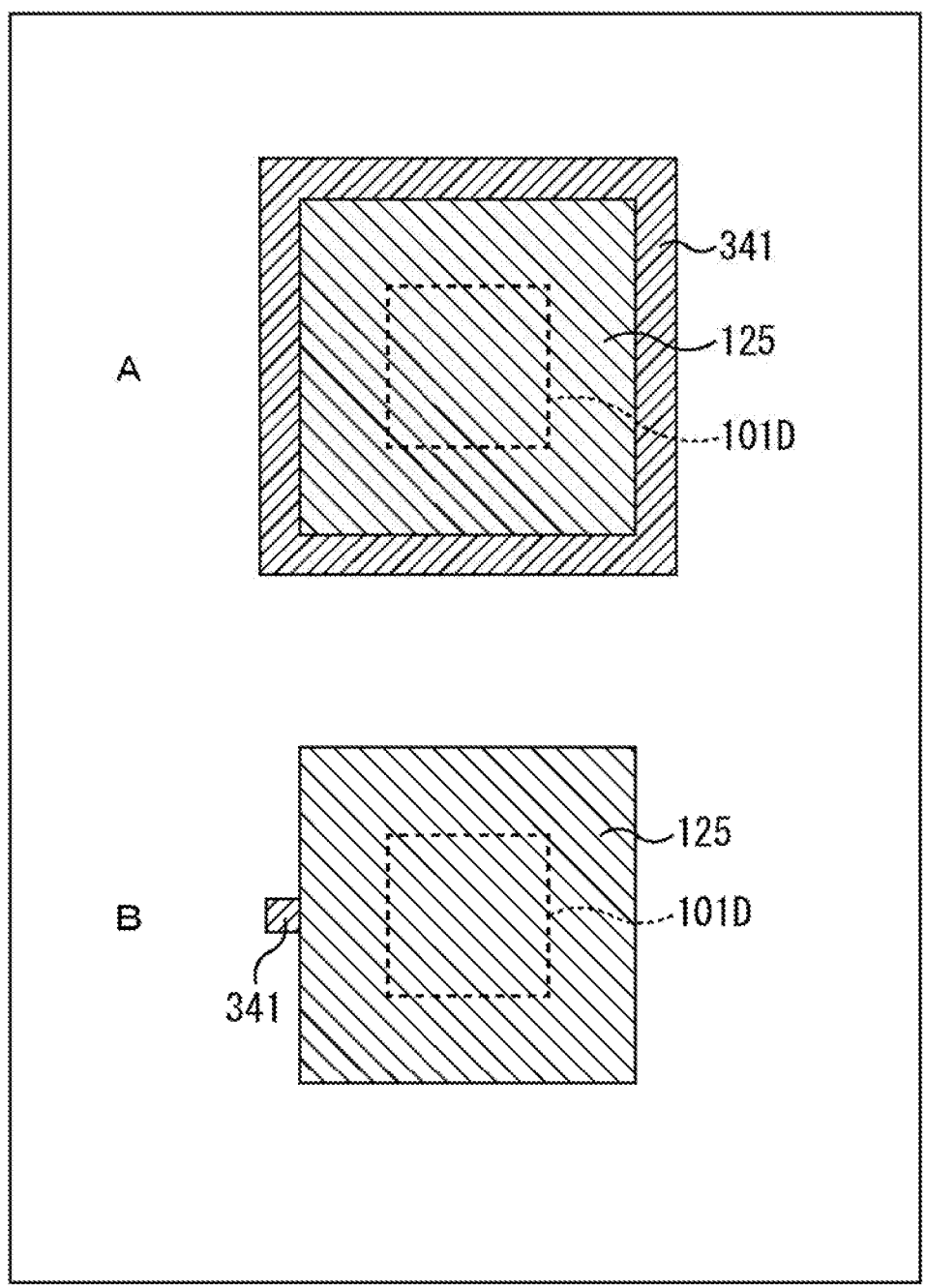
FIG. 18 is a view depicting an example of connection of a pad of the CMOS image sensor of FIG. 17.

For example, as depicted in A of FIG. 18, the via 341 may be made to contact the side surface of the pad 125 so as to surround the side surface of the pad 125.

In addition, for example, as depicted in B of FIG. 18, the via 341 may be made to contact a part of the side surface of the pad 125.

It should be noted that a position where the via 341 is made to contact the side surface of the pad 125 is not necessarily one position, and thus may be two or more positions. In addition, the position and number by which the via 341 is made to contact the side surface of the pad 125, for example, are determined from a viewpoint of the resistance value, the capacity, the reliability, and the like.

In addition, for example, the via 341 can also be connected to the wiring 144 underlying the Al wiring 321 of the wiring layer 102A of the control substrate 102. In addition, the via 341 can also be connected to the wiring 144 of the wiring layer 102A of the control substrate 102 without providing the Al wiring 321.

6. Modified Changes

Hereinafter, a description will be given with respect to modified changes of the embodiments of the present technique described above.

Although in the foregoing, the description has been given with respect to the example in which the present technique is applied to the back side illumination type CMOS image sensor having the laminated structure of the two layers: the pixel substrate; and the control substrate, the present technique can also be applied to the back side illumination type CMOS image sensor having the laminated structure of three or more layers. In addition, the present technique, for example, can also be applied to a laminated back side illumination type CMOS image sensor in which a control circuit is arranged on a pixel substrate, and a support substrate is laminated instead of the control substrate. Moreover, the present technique can also be applied to a back side illumination type CMOS image sensor in which a control circuit is arranged on the pixel substrate to obtain a single layer structure having only the pixel substrate as the substrate.

In addition, the number of layers or the structure of the wirings of the pixel substrate and the control substrate are by no means limited to the example described above, and can be arbitrarily changed.

In addition, the present technique is not limited to the application to the CMOS image sensor, but also is applied to a back side illumination type solid-state image pickup element other than the CMOS image sensor.

7. Examples of Use of Solid-State Image Pickup Element

Figure 19:
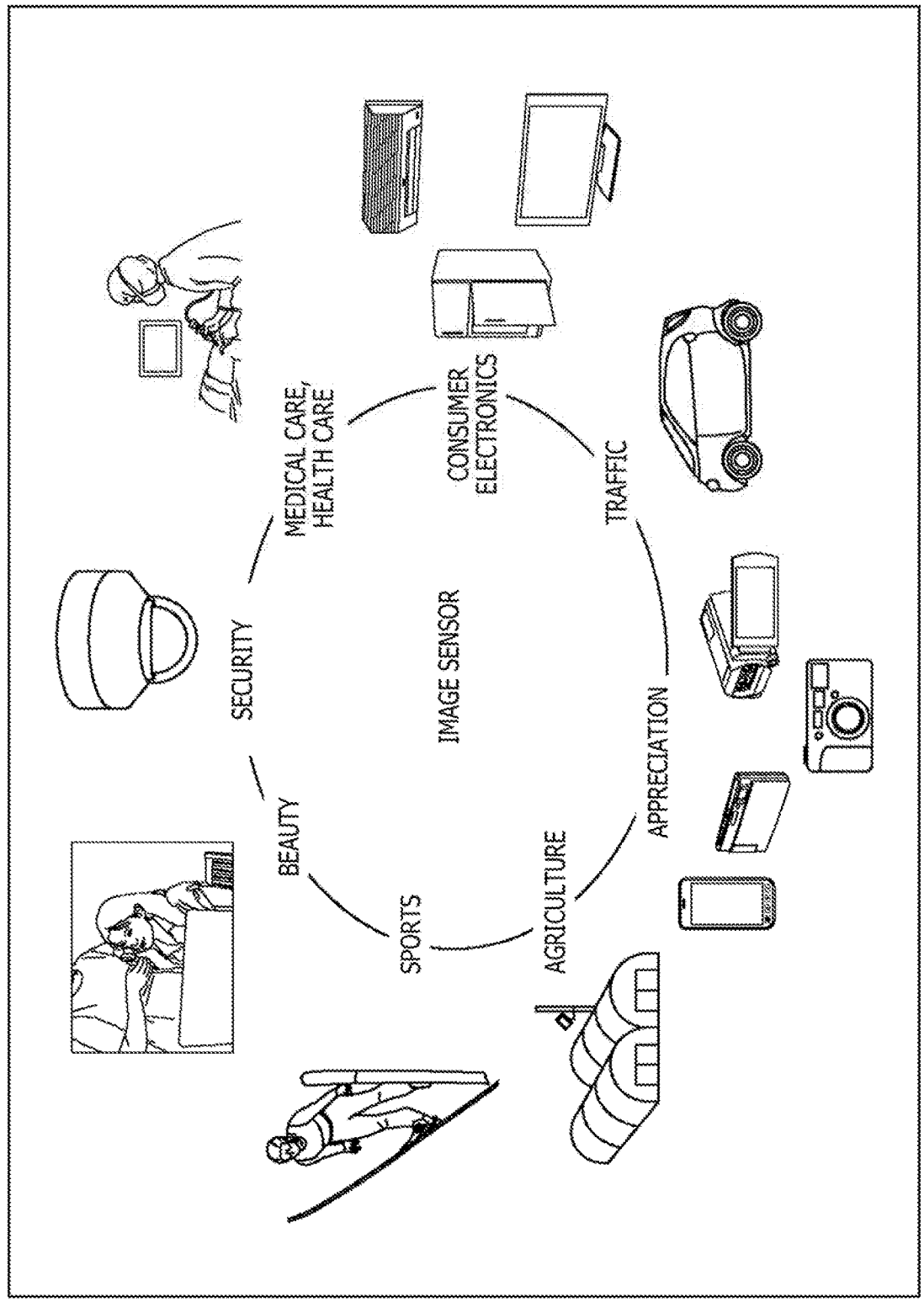
FIG. 19 is a view depicting examples of use of a solid-state image pickup element.

FIG. 19 is a view depicting examples of use of the solid-state image pickup element described above.

The solid-state image pickup element described above, for example, as will be described below, can be used in such various cases as to sense the light such as visible light, infrared radiation, ultraviolet rays, and X-rays.

Figure 20:
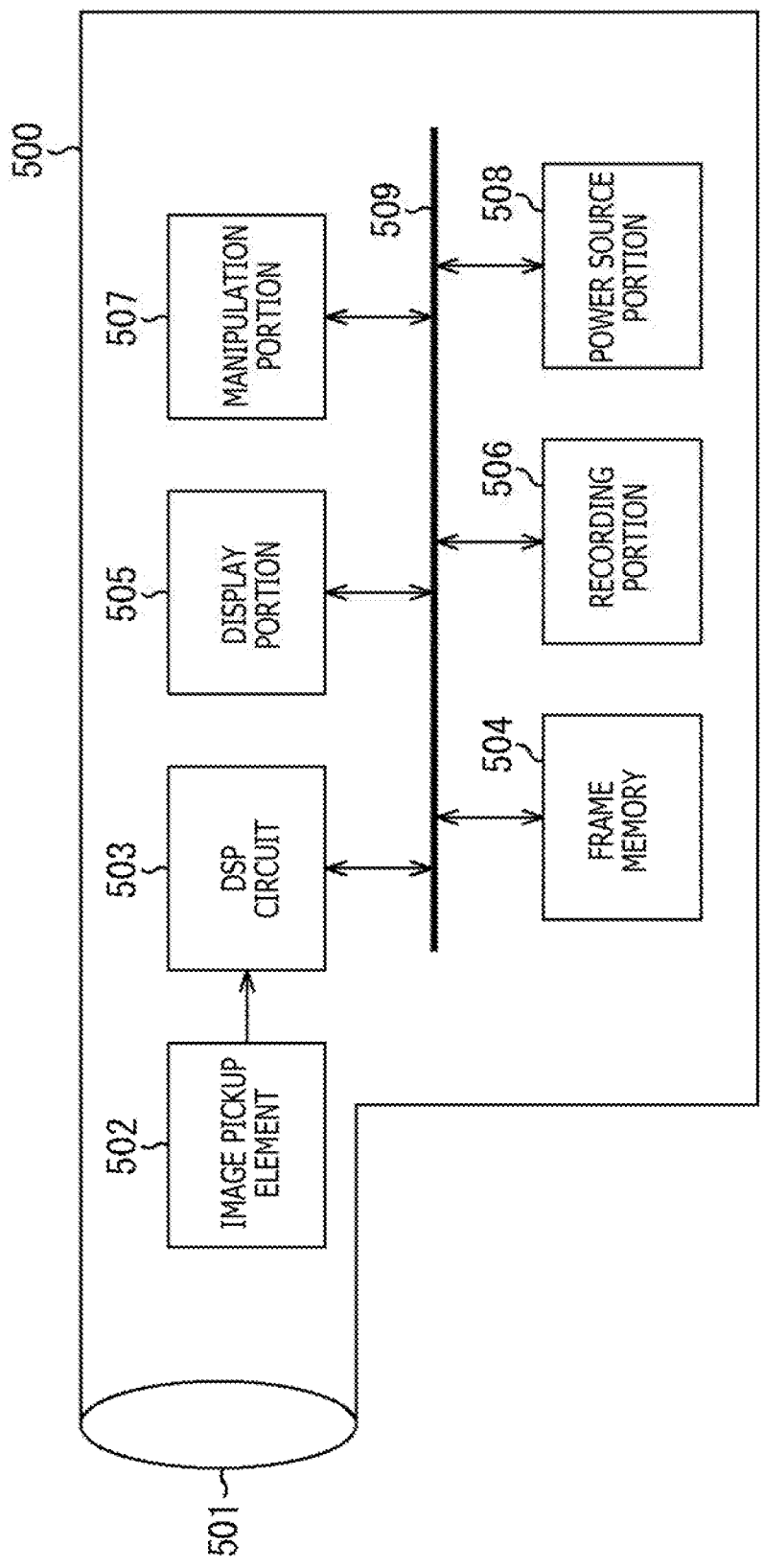
FIG. 20 is a block diagram depicting an example of a configuration of an electronic apparatus.

- An apparatus, for photographing an image for use in appreciation, such as a digital camera or a portable apparatus with a camera function
- An apparatus, for use in traffic, such as an on-board sensor for photographing, a front side, a rear side, a periphery, a car interior for safe driving such as automatic stop, recognition of a state of a driver, or the like, a monitoring camera for monitoring a road for a travelling vehicle, or a distance measuring sensor for measuring a distance between vehicles
- An apparatus, for use in a consumer electronics, such as a TV, a refrigerator, or an air conditioner, for imaging a gesture of a user to carry out an apparatus operation responding to the gesture
- An apparatus, for use in medical care or health care, such as an endoscope, or an apparatus for photographing a blood vessel by receiving infrared rays
- An apparatus, for use in security, such as a monitoring camera for security applications, or a camera for person authentication applications
- An apparatus, for use in beauty, such as a skin measuring instrument for photographing a skin, or a microscope for photographing a scalp
- An apparatus, for sport, such as an action camera or a wearable camera for sport applications
- An apparatus, for use in agriculture, such as a camera for monitoring a state of a field or crops Image Pickup Apparatus FIG. 20 is a block diagram depicting an example of a configuration of an electronic apparatus 500 having a semiconductor device to which the present technique is applied.

The electronic apparatus 500, for example, is an electronic apparatus such as an image pickup apparatus such as a digital still camera or a video camera, or a mobile terminal apparatus such as a smartphone or a tablet type terminal.

In FIG. 20, the electronic apparatus 500 includes a lens 501, an image pickup element 502, a DSP circuit 503, a frame memory 504, a display portion 505, a recording portion 506, a manipulation portion 507, and a power source portion 508. In addition, in the electronic apparatus 500, the DSP circuit 503, the frame memory 504, the display portion 505, the recording portion 506, the manipulation portion 507, and the power source portion 508 are connected to one another through a bus line 509.

The image pickup element 502, for example, corresponds to each of the CMOS image sensors 10a to 10d described above.

The DSP circuit 503 is a camera signal processing circuit for processing a signal supplied thereto from the image pickup element 502. The DSP circuit 503 outputs image data which is obtained by processing the signal from the image pickup element 502. The frame memory 504 temporarily holds therein the image data obtained by executing the processing in the DSP circuit 503 in units of a frame.

The display portion 505, for example, is composed of a panel type display device such as a liquid crystal panel or an organic EL (Electro Luminescence) panel, and displays thereon a moving image or a still image captured by the image pickup element 502. The recording portion 506 records the image data associated with the moving image or the still image captured by the image pickup element 502 in a recording medium such as a semiconductor memory or a hard disc.

The manipulation portion 507 outputs a manipulation instruction about various kinds of functions which the electronic apparatus 500 has in accordance with a manipulation made by a user. The power source portion 508 suitably supplies various kinds of power sources becoming operation power sources of the DSP circuit 503, the frame memory 504, the display portion 505, the recording portion 506, and the manipulation portion 507 to these supply objects.

It should be noted that the embodiments of the present technique are by no means limited to these embodiments described above, and various changes can be made without departing from the subject matter of the present technique.

In addition, for example, the present technique can also adopt the following constitutions.

(1)
A solid-state image pickup element including:
a pixel substrate in which
a light condensing layer for condensing incident light on a photoelectric conversion element,
a semiconductor layer in which the photoelectric conversion element is formed, and
a wiring layer in which a wiring and a pad for outside connection are formed
are laminated on one another, and at least a part of a first surface of the pad is exposed through a through hole completely extending through the light condensing layer and the semiconductor layer.

(2)
The solid-state image pickup element according to (1) described above, in which the wiring of the wiring layer is connected to a second surface on a side opposite to the first surface of the pad through a via.

(3)
The solid-state image pickup element according to (1) described above, in which the wiring of the wiring layer is connected to a side surface of the pad.

(4)
The solid-state image pickup element according to any one of (1) to (3) described above, further including:
a control substrate provided with a control circuit, and laminated on the wiring layer side of the pixel substrate.

(5)
The solid-state image pickup element according to any one of (1) to (3) described above, further including:
a support substrate laminated on the wiring layer side of the pixel substrate.

(6)
The solid-state image pickup element according to (1) described above, further including:
a control substrate in which a control circuit is arranged and which is laminated on the wiring layer side of the pixel substrate;
a first via completely extending through the semiconductor layer to be connected to the first surface of the pad; and
a second via connected to the first via in the light condensing layer, and completely extending through the semiconductor layer and the wiring layer to be connected to a wiring of the control substrate.

(7)

The solid-state image pickup element according to (1) described above, further including:

a control substrate in which a control circuit is arranged and which is laminated on the wiring layer side of the pixel substrate; and a via which completely extends through the semiconductor layer and the wiring layer, and through which a side surface of the pad and a wiring of the control substrate are connected to each other.

(8)

An electronic apparatus including:

a solid-state image pickup element; and a signal processing portion for processing a signal output from the solid-state image pickup element, the solid-state image pickup element including a pixel substrate in which a light condensing layer for condensing incident light on a photoelectric conversion element, a semiconductor layer in which the photoelectric conversion element is formed, and a wiring layer in which a wiring and a pad for outside connection are formed are laminated on one another, and at least a part of a first surface of the pad is exposed through a through hole completely extending through the light condensing layer and the semiconductor layer.

REFERENCE SIGNS LIST 10, 10a to 10d CMOS image sensor, 11 Pixel array portion, 12 Vertical drive portion, 13 Column processing portion, 14 Horizontal drive portion, 15 System control portion, 16 Pixel drive line, 17 Vertical signal line, 18 Signal processing portion, 19 Data storing portion, 51 Photoelectric conversion element, 52 Transfer gate portion, 53 Charge-to-voltage converting portion, 54 Reset gate portion, 55 Amplifying transistor, 56 Selection transistor, 101 Pixel substrate, 101A Light condensing layer, 101B Semiconductor layer, 101C Wiring layer, 102 Control substrate, 102A Wiring layer, 102B Semiconductor layer, 121 On-chip microlens, 123 Wiring, 124 Via, 125, 126 Pad, 141 Pad, 142 Via, 143 Al wiring, 144 Wiring, 301 Via, 302 Wiring, 303 Via, 321 Al wiring, 341 Via, 500 Electronic apparatus, 502 Image pickup element, 503 DSP circuit

The invention claimed is:

1. A solid-state image pickup element, comprising:
a first semiconductor section including:
a first semiconductor layer including a plurality of photoelectric conversion elements, and
a first multilayer wiring layer including a pad for external connection, a plurality of first wiring layers including wirings, and a first pad; and
a second semiconductor section including:
a second semiconductor layer including a logic circuit, and
a second multilayer wiring layer including a second pad;
wherein the first and second semiconductor sections are bonded together such that the first pad of the first multilayer wiring layer and the second pad of the second multilayer wiring layer are directly bonded to each other, wherein a first surface of the pad for external connection is electrically connected to the first pad via one wiring of one of the plurality of first wiring layers,
wherein a thickness of the pad for external connection is greater than a thickness of the first pad, and
wherein a height of the pad for external connection is below a height of a first layer of the plurality of first wiring layers in a vertical direction and a depth of the pad for external connection is below a depth of a lowest most layer of the plurality of first wiring layers in the vertical direction.

2. The solid-state image pickup element according to claim 1, wherein at least a portion of a second surface of the pad for external connection opposite to the first surface of the pad for external connection is exposed by a hole extending through the first semiconductor layer.

3. The solid-state image pickup element according to claim 1, wherein the first pad includes copper.

4. The solid-state image pickup element according to claim 1, wherein the second pad includes copper.

5. The solid-state image pickup element according to claim 1, wherein the thickness of the pad for external connection is greater than a thickness of the second pad.

6. The solid-state image pickup element according to claim 1, wherein the pad for external connection is arranged over several layers of the plurality of first wiring layers of the first multilayer wiring layer.

7. The solid-state image pickup element according to claim 1, wherein another wiring of one of the plurality of first wiring layers is connected to another surface of the pad for external connection, adjacent to the first and second surfaces of the pad for external connection.

8. The solid-state image pickup element according to claim 1, wherein the second surface of the pad for external connection is a light receiving surface.

9. The solid-state image pickup element according to claim 1, wherein the pad for external connection has a form of a geometric shape.

10. The solid-state image pickup element according to claim 1, further comprising an on-chip microlens and a color filter provided above the plurality of photoelectric conversion elements.

11. The solid-state image pickup element according to claim 10, wherein the pad for external connection is formed in a region opposite to a region where the on-chip microlens and the color filter are formed.

12. The solid-state image pickup element according to claim 1, further comprising a plurality of pixel transistors.

13. The solid-state image pickup element according to claim 12, wherein the plurality of pixel transistors includes a transfer transistor, a reset transistor, an amplification transistor, and a select transistor.

14. The solid-state image pickup element according to claim 1, wherein the second multilayer wiring layer includes a plurality of second wiring layers including wirings.

15. An electronic apparatus, comprising:
a solid-state image pickup element; and
a signal processing portion for processing a signal output from the solid-state image pickup element,
wherein the solid-state image pickup element includes:
a first semiconductor section including:
a first semiconductor layer including a plurality of photoelectric conversion elements, and
a first multilayer wiring layer including a pad for external connection, a plurality of first wiring layers including wirings, and a first pad; and a second semiconductor section including:
- a second semiconductor layer including a logic circuit, and
- a second multilayer wiring layer including a second pad;

wherein the first and second semiconductor sections are bonded together such that the first pad of the first multilayer wiring layer and the second pad of the second multilayer wiring layer are directly bonded to each other, wherein a first surface of the pad for external connection is electrically connected to the first pad via one wiring of one of the plurality of first wiring layers through a via, wherein a thickness of the pad for external connection is greater than a thickness of the first pad, and wherein a height of the pad for external connection is below a height of a first layer of the plurality of first wiring layers in a vertical direction and a depth of the pad for external connection is below a depth of a lowest most layer of the plurality of first wiring layers in the vertical direction.

16. The electronic apparatus according to claim 15, wherein at least a portion of a second surface of the pad for external connection opposite to the first surface of the pad for external connection is exposed by a hole extending through the first semiconductor layer.

17. The electronic apparatus according to claim 15, wherein the thickness of the pad for external connection is greater than a thickness of the second pad.

18. The electronic apparatus according to claim 15, wherein the pad for external connection is arranged over several layers of the plurality of first wiring layers of the first multilayer wiring layer.

19. A solid-state image pickup element, comprising:
a first semiconductor section including:
- a first semiconductor layer including a plurality of photoelectric conversion elements, and
- a first multilayer wiring layer including a pad for external connection, a wiring, and a first pad; and a second semiconductor section including:
- a second semiconductor layer including a logic circuit, and
- a second multilayer wiring layer including a second pad;

wherein the first and second semiconductor sections are bonded together such that the first pad of the first multilayer wiring layer and the second pad of the second multilayer wiring layer are directly bonded to each other, wherein a first surface of the pad for external connection is electrically connected to the first pad via the wiring, wherein a thickness of the pad for external connection is greater than a thickness of the first pad, and wherein another wiring of the first multilayer wiring layer is connected to another surface of the pad for external connection, adjacent to the first surface and a second surface of the pad for external connection.

* * * * *